(12) United States Patent
Yu et al.

(10) Patent No.: US 11,121,089 B2
(45) Date of Patent: Sep. 14, 2021

(54) INTEGRATED CIRCUIT PACKAGE AND METHOD

(71) Applicant: Taiwan Semiconductor Manufacturing Company, Ltd., Hsinchu (TW)

(72) Inventors: Jen-Jui Yu, Taipei (TW); Hao-Jan Pei, Hsinchu (TW); Wei-Yu Chen, Taipei (TW); Chia-Lun Chang, Tainan (TW); Hsiu-Jen Lin, Zhubei (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/458,960

(22) Filed: Jul. 1, 2019

(65) Prior Publication Data
US 2020/0176387 A1 Jun. 4, 2020

Related U.S. Application Data

(60) Provisional application No. 62/773,482, filed on Nov. 30, 2018.

(51) Int. Cl.
*H01L 23/538* (2006.01)
*H01L 23/31* (2006.01)
(Continued)

(52) U.S. Cl.
CPC ........ *H01L 23/5389* (2013.01); *H01L 21/486* (2013.01); *H01L 21/4853* (2013.01); *H01L 21/4857* (2013.01); *H01L 21/563* (2013.01); *H01L 21/565* (2013.01); *H01L 23/3128* (2013.01); *H01L 23/5383* (2013.01);
(Continued)

(58) Field of Classification Search
CPC .......... H01L 23/49811; H01L 23/5389; H01L 21/486; H01L 25/0657; H01L 25/065
See application file for complete search history.

(56) References Cited

U.S. PATENT DOCUMENTS 6,297,559 B1 * 10/2001 Call ................... H01L 23/49816
257/778
8,361,842 B2 1/2013 Yu et al.
(Continued)

FOREIGN PATENT DOCUMENTS

CN 1574305 A 2/2005
CN 101621011 A 1/2010
(Continued)

*Primary Examiner* — Brian Turner
(74) *Attorney, Agent, or Firm* — Slater Matsil, LLP

(57) ABSTRACT

In an embodiment, a device includes: an integrated circuit die; an encapsulant at least partially encapsulating the integrated circuit die; a redistribution structure on the encapsulant, the redistribution structure being electrically connect to the integrated circuit die, the redistribution structure including a pad; a passive device including a conductive connector physically and electrically connected to the pad; and a protective structure disposed between the passive device and the redistribution structure, the protective structure surrounding the conductive connector, the protective structure including an epoxy flux, the protective structure having a void disposed therein.

20 Claims, 25 Drawing Sheets

(51) Int. Cl.
　　*H01L 21/56* (2006.01)
　　*H01L 21/48* (2006.01)
　　*H01L 25/10* (2006.01)
　　*H01L 23/00* (2006.01)
　　*H01L 25/16* (2006.01)
　　*H01L 25/00* (2006.01)
　　*H01L 25/065* (2006.01)

(52) U.S. Cl.
　　CPC .......... *H01L 23/5386* (2013.01); *H01L 24/19* (2013.01); *H01L 24/24* (2013.01); *H01L 24/97* (2013.01); *H01L 25/16* (2013.01); *H01L 25/50* (2013.01); *H01L 25/0655* (2013.01); *H01L 25/0657* (2013.01); *H01L 25/105* (2013.01); *H01L 2224/24225* (2013.01); *H01L 2224/24265* (2013.01); *H01L 2225/0651* (2013.01); *H01L 2225/06548* (2013.01); *H01L 2225/06568* (2013.01); *H01L 2225/06586* (2013.01); *H01L 2225/1035* (2013.01); *H01L 2225/1058* (2013.01); *H01L 2924/19102* (2013.01)

(56) References Cited

U.S. PATENT DOCUMENTS

| | | | |
|---|---|---|---|
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,877,554 | B2 | 11/2014 | Tsai et al. |
| 2004/0238948 | A1* | 12/2004 | Shiozawa ............... H01L 25/50 257/723 |
| 2004/0253803 | A1 | 12/2004 | Tomono et al. |
| 2008/0042279 | A1* | 2/2008 | Bang .................. H01L 21/4853 257/738 |
| 2010/0001411 | A1 | 1/2010 | Sawada et al. |
| 2010/0055846 | A1* | 3/2010 | Lii ...................... H01L 23/3192 438/124 |
| 2010/0133704 | A1* | 6/2010 | Marimuthu ............ H01L 24/16 257/778 |
| 2010/0147928 | A1* | 6/2010 | Wettermann ......... H05K 3/3436 228/180.22 |
| 2011/0291288 | A1 | 12/2011 | Wu et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0096379 | A1 | 4/2014 | Saeki et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2014/0367867 | A1 | 12/2014 | Lin et al. |
| 2015/0001704 | A1* | 1/2015 | Lu ........................ H01L 24/14 257/737 |
| 2016/0071820 | A1* | 3/2016 | Yu ...................... H01L 21/6836 257/737 |
| 2017/0040298 | A1* | 2/2017 | Chen ................. H01L 25/0657 |
| 2017/0278816 | A1* | 9/2017 | Li ......................... H01L 24/14 |
| 2017/0301559 | A1* | 10/2017 | Wang ............... H01L 21/4853 |
| 2018/0033771 | A1* | 2/2018 | Yu ....................... H01L 23/3114 |
| 2018/0082988 | A1 | 3/2018 | Cheng et al. |
| 2018/0092211 | A1 | 3/2018 | Minegishi |
| 2018/0151453 | A1 | 5/2018 | Yu et al. |
| 2018/0151530 | A1 | 5/2018 | Chen et al. |

FOREIGN PATENT DOCUMENTS

| | | |
|---|---|---|
| CN | 108122857 A | 6/2018 |
| JP | 2903697 B2 | 6/1999 |
| JP | 2000323523 A | 11/2000 |
| JP | 2001244298 A | 9/2001 |
| JP | 2018056234 A | 4/2018 |
| KR | 20160036655 A | 4/2016 |
| WO | 2012164957 A1 | 12/2012 |

* cited by examiner

INTEGRATED CIRCUIT PACKAGE AND METHOD

PRIORITY CLAIM AND CROSS-REFERENCE

This application claims the benefit of U.S. Provisional Application No. 62/773,482, filed on Nov. 30, 2018, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
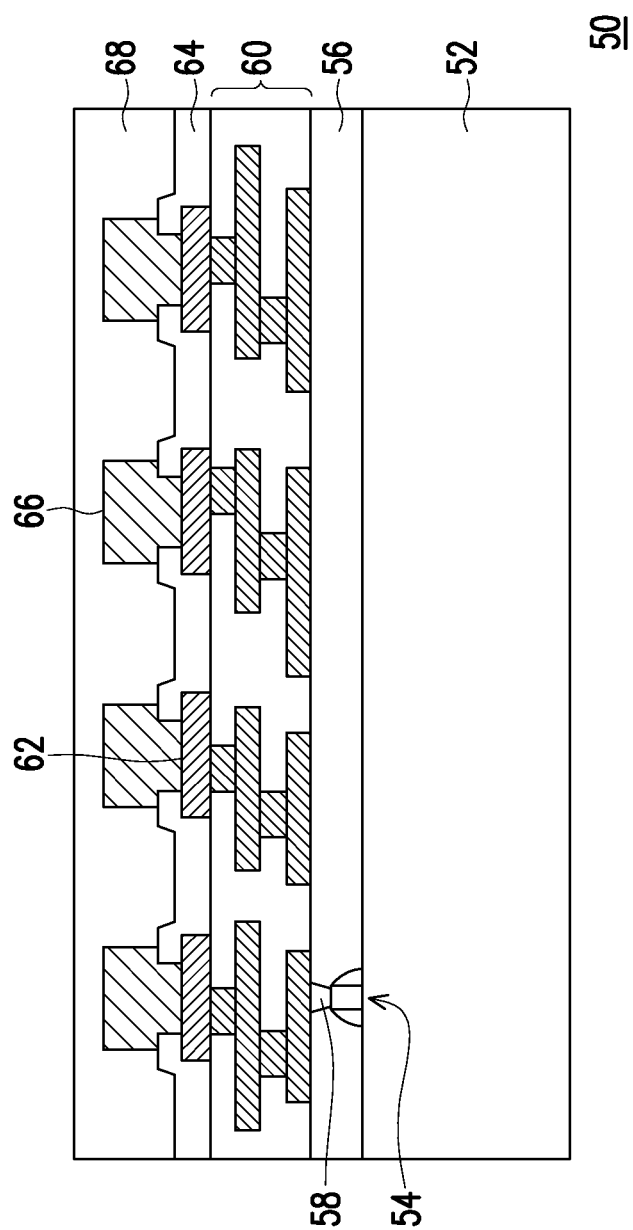
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a redistribution structure is formed, and a protective structure is prefilled on a surface of the redistribution structure. The protective structure is formed of an epoxy flux, is directly printed on contact pads of the redistribution structure, and is not cured immediately after printing. A surface-mounted device (SMD), such as a passive device, is pressed into the uncured protective structure to physically and electrically couple the contact pads of the redistribution structure. External connectors, such as solder connectors, are also formed on pads of the redistribution structure. A single thermal processing step is performed to simultaneously cure the protective structure and reflow the external connectors and passive device contacts. By delaying the curing and performing the curing concurrently with the reflowing, one or more thermal processing steps may be omitted, thereby decreasing wafer processing time and manufacturing costs.

FIG. 1 illustrates a cross-sectional view of an integrated circuit die 50, in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that include multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 21 illustrate cross-sectional views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
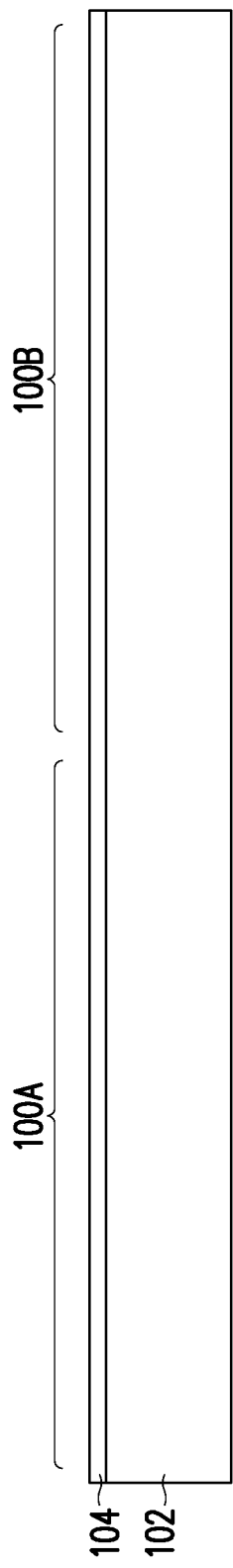
FIGS. 2, 3, 4, 5, 6, 7, 8, 9, 10, 11, 12, 13, 14, 16, 17, 18, 20, and 21 illustrate cross-sectional views of intermediate steps during a process for forming a package component, in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
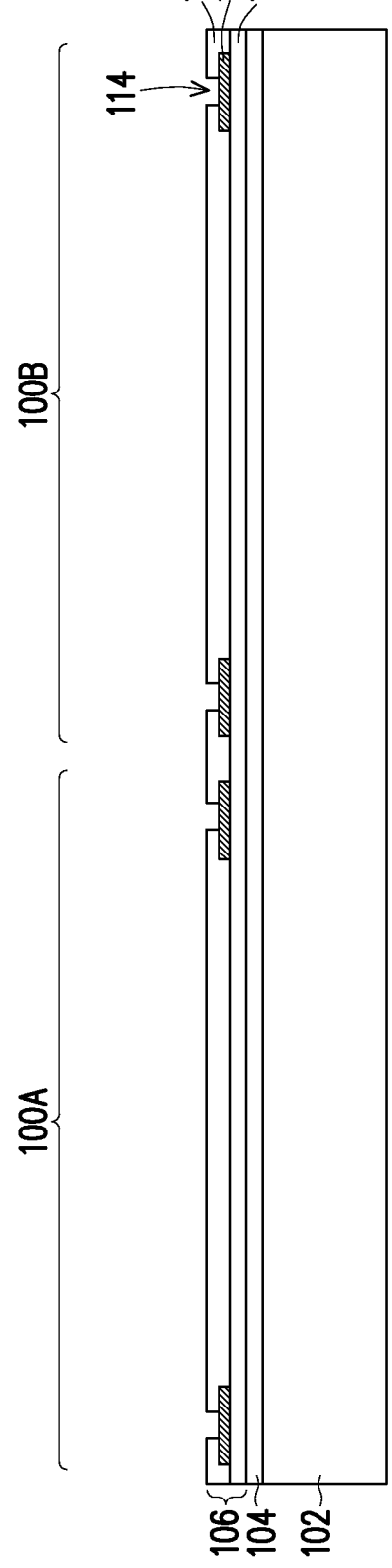

In FIG. 3, a back-side redistribution structure 106 may be formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, CVD, laminating, the like, or a combination thereof.

The metallization pattern 110 may be formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure.

It should be appreciated that the back-side redistribution structure 106 may include any number of dielectric layers and metallization patterns. If more dielectric layers and metallization patterns are to be formed, steps and processes discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 4:
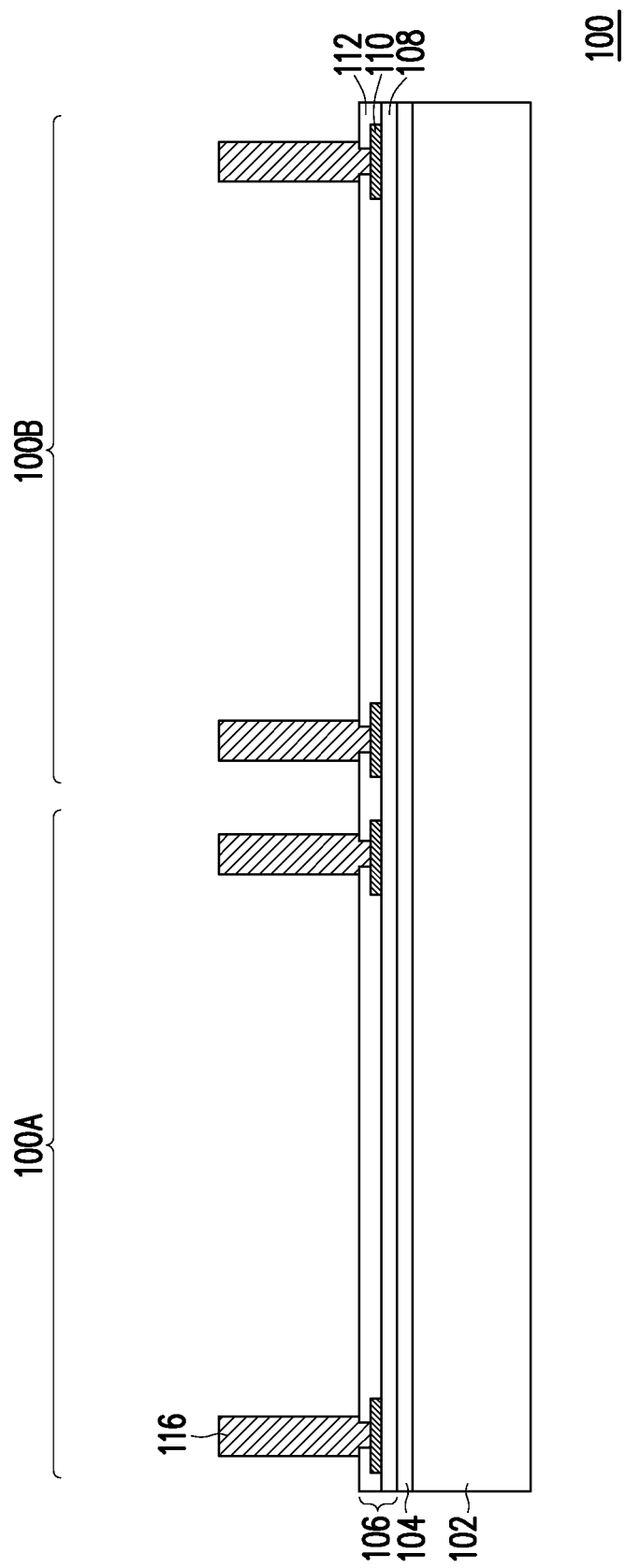

In FIG. 4, through vias 116 are formed in the openings 114 and extending away from the topmost dielectric layer of the back-side redistribution structure 106 (e.g., the dielectric layer 112). As an example to form the through vias 116, a seed layer is formed over the back-side redistribution structure 106, e.g., on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 5:
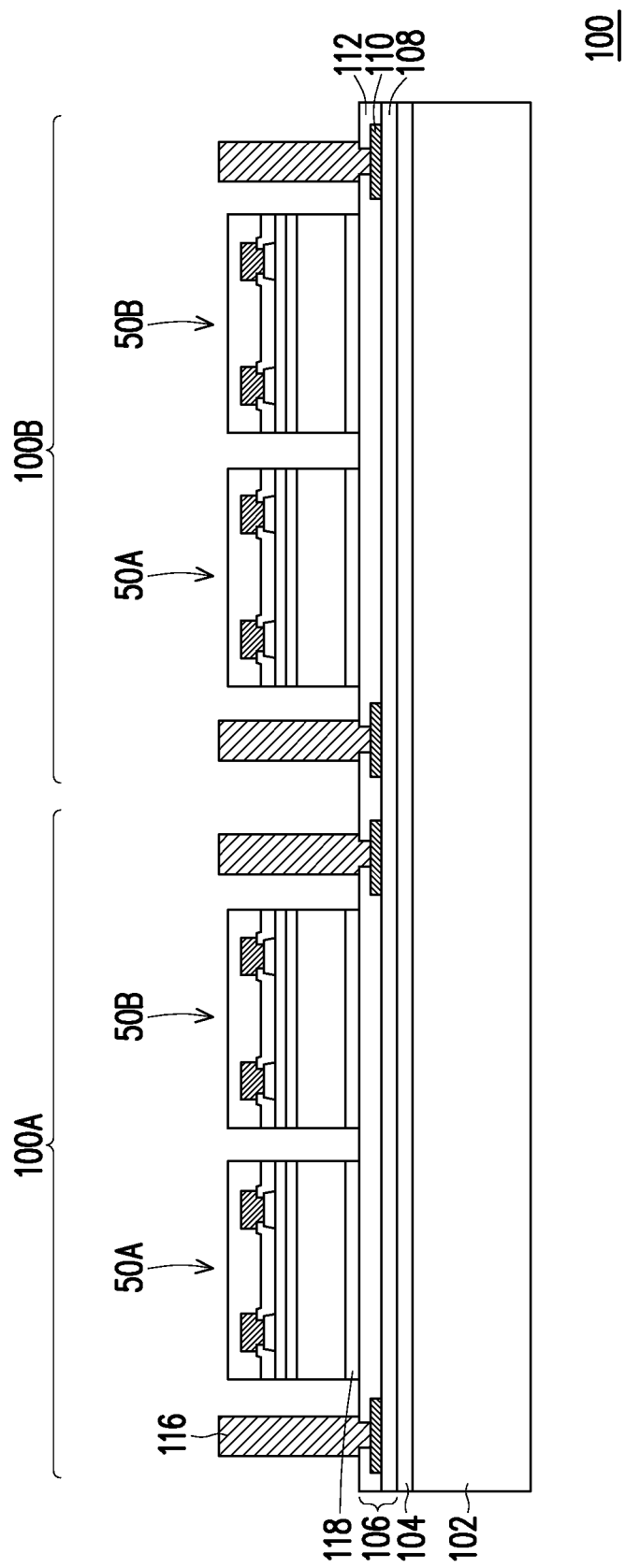

In FIG. 5, integrated circuit dies 50 are adhered to the dielectric layer 112 by an adhesive 118. A desired type and quantity of integrated circuit dies 50 are adhered in each of the package regions 100A and 100B. In the embodiment shown, multiple integrated circuit dies 50 are adhered adjacent one another, including a first integrated circuit die 50A and a second integrated circuit die 50B. The first integrated circuit die 50A may be a logic device, such as a central processing unit (CPU), graphics processing unit (GPU), system-on-a-chip (SoC), microcontroller, or the like. The second integrated circuit die 50B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the package regions 100A and 100B may be limited, particularly when the integrated circuit dies 50A and 50B include devices with a large footprint, such as SoCs. Use of the back-side redistribution structure 106 allows for an improved interconnect arrangement when the package regions 100A and 100B have limited space available for the through vias 116.

The adhesive 118 is on back-sides of the integrated circuit dies 50A and 50B and adheres the integrated circuit dies 50A and 50B to the back-side redistribution structure 106, such as to the dielectric layer 112. The adhesive 118 may be any suitable adhesive, epoxy, die attach film (DAF), or the like. The adhesive 118 may be applied to back-sides of the integrated circuit dies 50A and 50B or may be applied over the surface of the carrier substrate 102. For example, the adhesive 118 may be applied to the back-sides of the integrated circuit dies 50A and 50B before singulating to separate the integrated circuit dies 50A and 50B.

Figure 6:
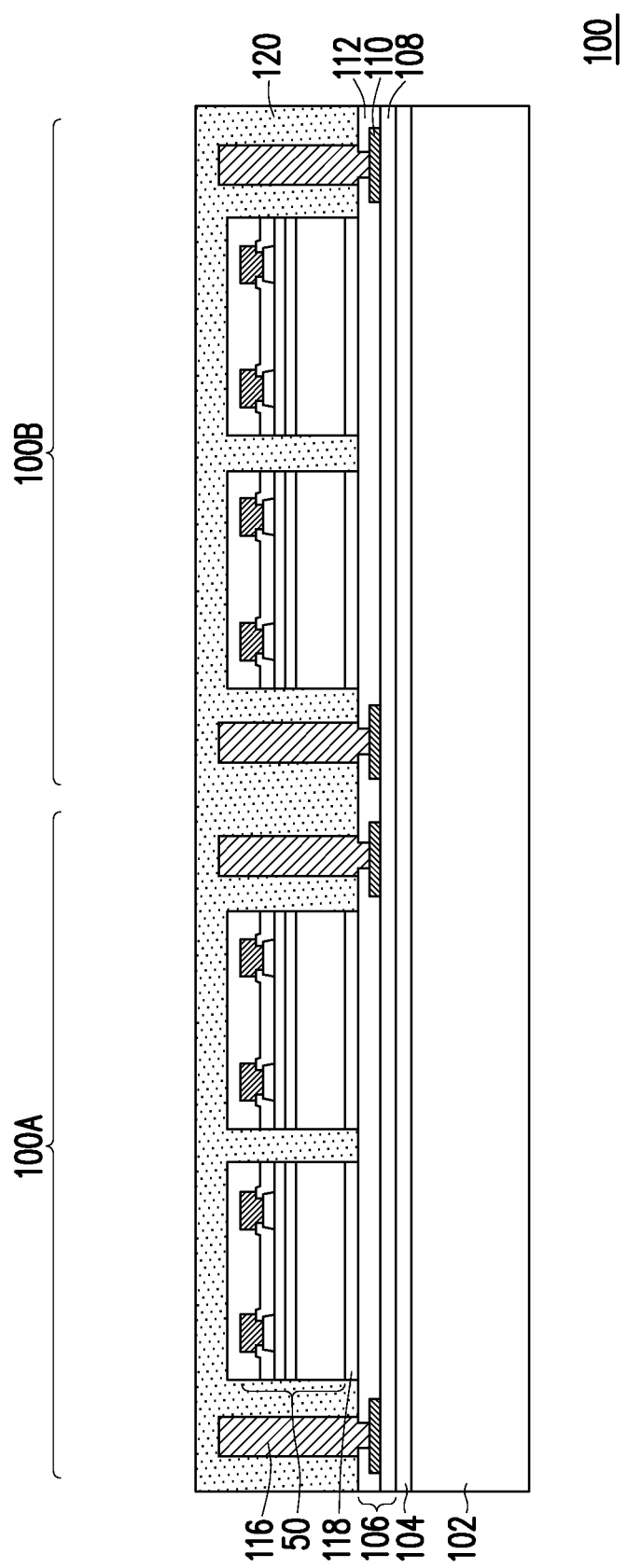

In FIG. 6, an encapsulant 120 is formed on and around the various components. After formation, the encapsulant 120 encapsulates the through vias 116 and integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50, if present. The encapsulant 120 may be applied in liquid or semi-liquid form and then subsequently cured.

Figure 7:
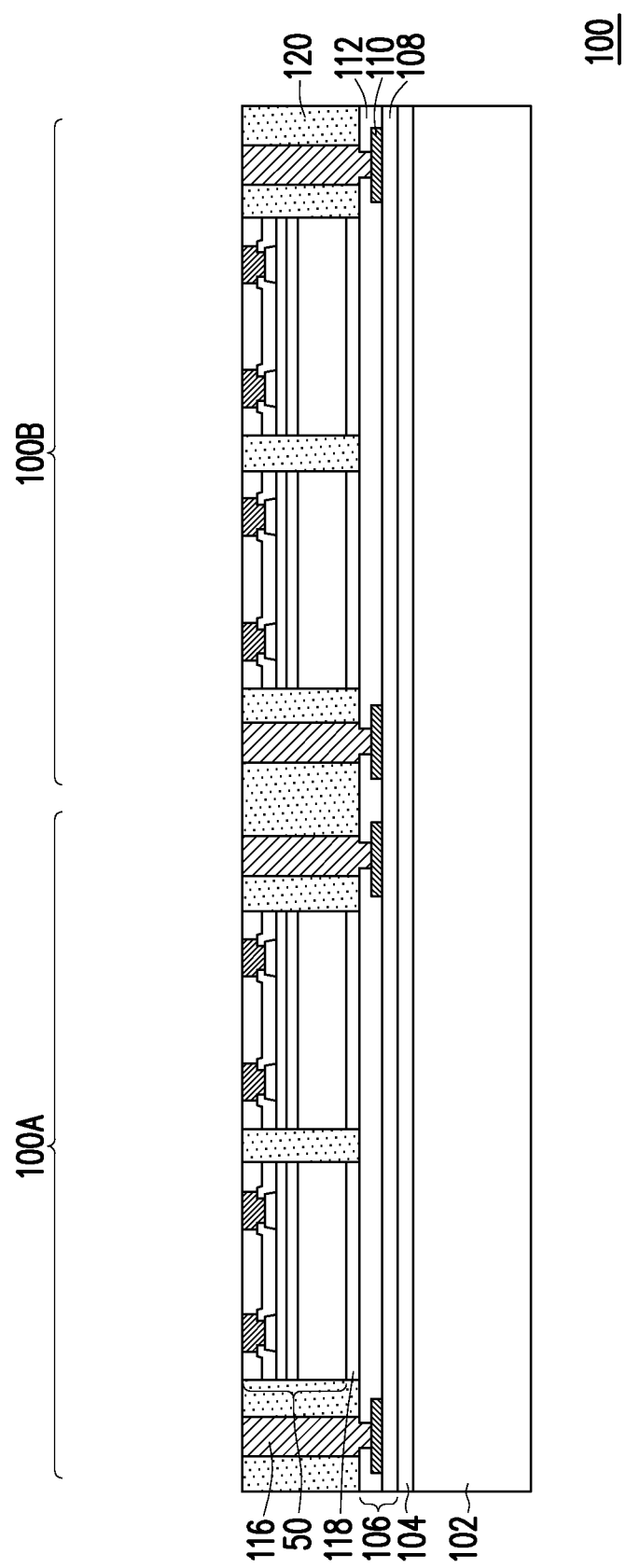

In FIG. 7, a planarization process is performed on the encapsulant 120 to expose the through vias 116 and the die connectors 66. The planarization process may also remove material of the through vias 116, dielectric layer 68, and/or die connectors 66 until the die connectors 66 and through vias 116 are exposed. Top surfaces of the through vias 116, die connectors 66, dielectric layer 68, and encapsulant 120 are coplanar after the planarization process. The planarization process may be, for example, a chemical-mechanical polish (CMP), a grinding process, or the like. In some embodiments, the planarization may be omitted, for example, if the through vias 116 and/or die connectors 66 are already exposed.

In FIGS. 8 through 12, a front-side redistribution structure 122 (see FIG. 11) is formed over the encapsulant 120, through vias 116, and integrated circuit dies 50. The front-side redistribution structure 122 includes dielectric layers 124, 128, 132, and 136; metallization patterns 126, 130, and 134; and pads 138A and 138B. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

Figure 8:
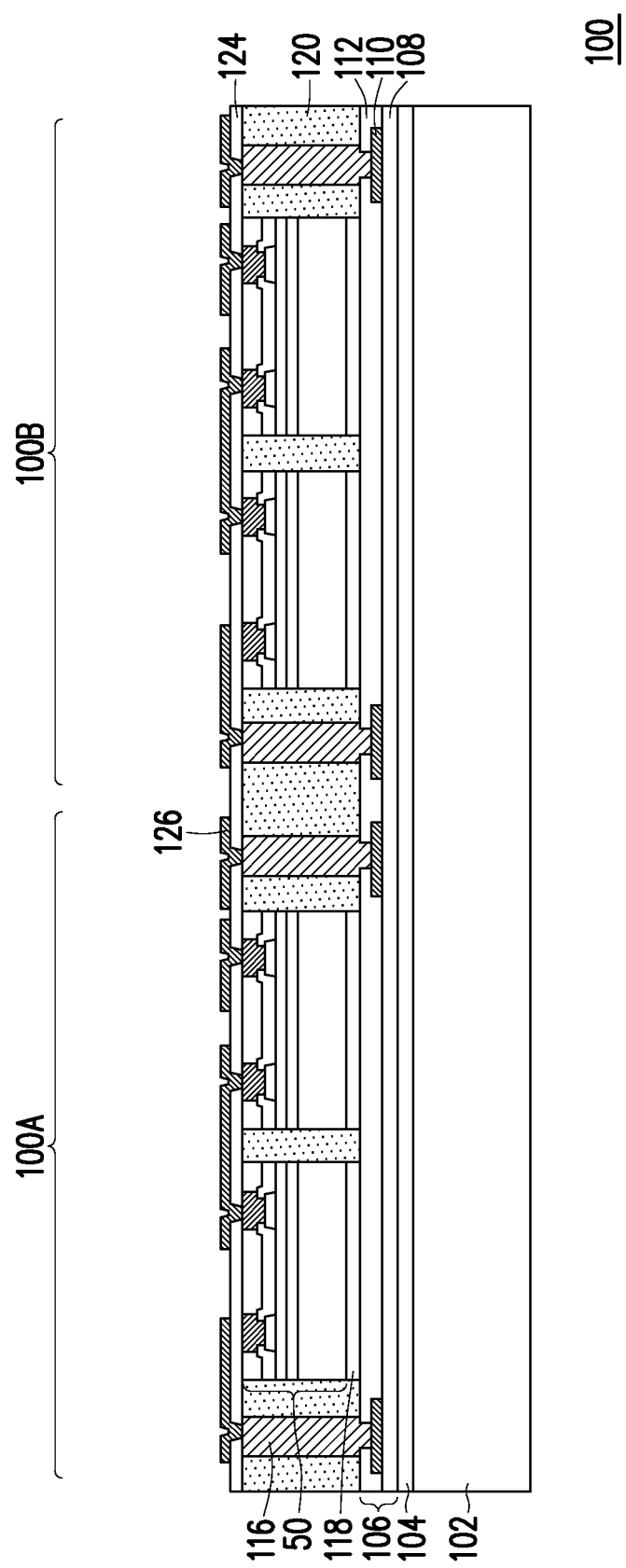

In FIG. 8, the dielectric layer 124 is deposited on the encapsulant 120, through vias 116, and die connectors 66. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the through vias 116 and the die connectors 66. The patterning may be by an acceptable process, such as by exposing the dielectric layer 124 to light when the dielectric layer 124 is a photo-sensitive material or by etching using, for example, an anisotropic etch. If the dielectric layer 124 is a photo-sensitive material, the dielectric layer 124 can be developed after the exposure.

The metallization pattern 126 is then formed. The metallization pattern 126 includes line portions (also referred to as conductive lines) on and extending along the major surface of the dielectric layer 124. The metallization pattern 126 further includes via portions (also referred to as conductive vias) extending through the dielectric layer 124 to physically and electrically couple the through vias 116 and the integrated circuit dies 50. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 9:
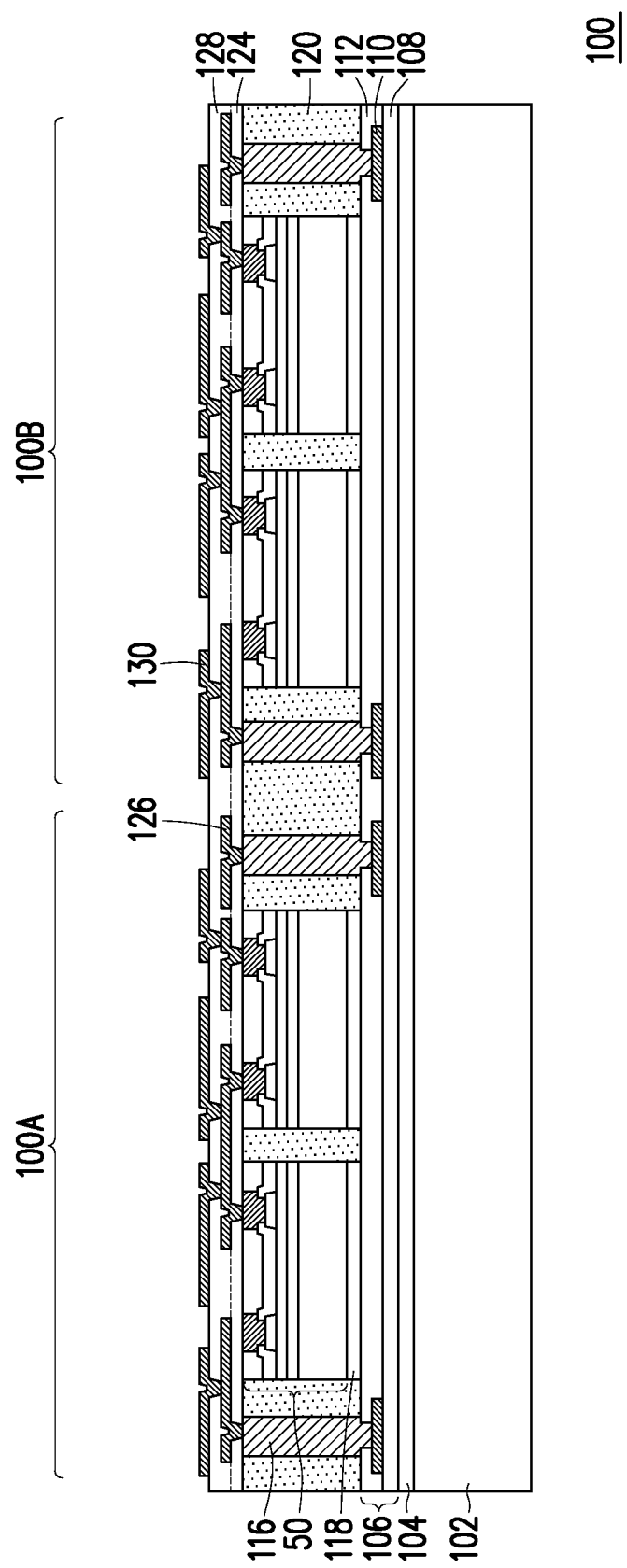

In FIG. 9, the dielectric layer 128 is deposited on the metallization pattern 126 and dielectric layer 124. The dielectric layer 128 may be formed in a manner similar to the dielectric layer 124, and may be formed of a similar material as the dielectric layer 124.

The metallization pattern 130 is then formed. The metallization pattern 130 includes line portions on and extending along the major surface of the dielectric layer 128. The metallization pattern 130 further includes via portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 10:
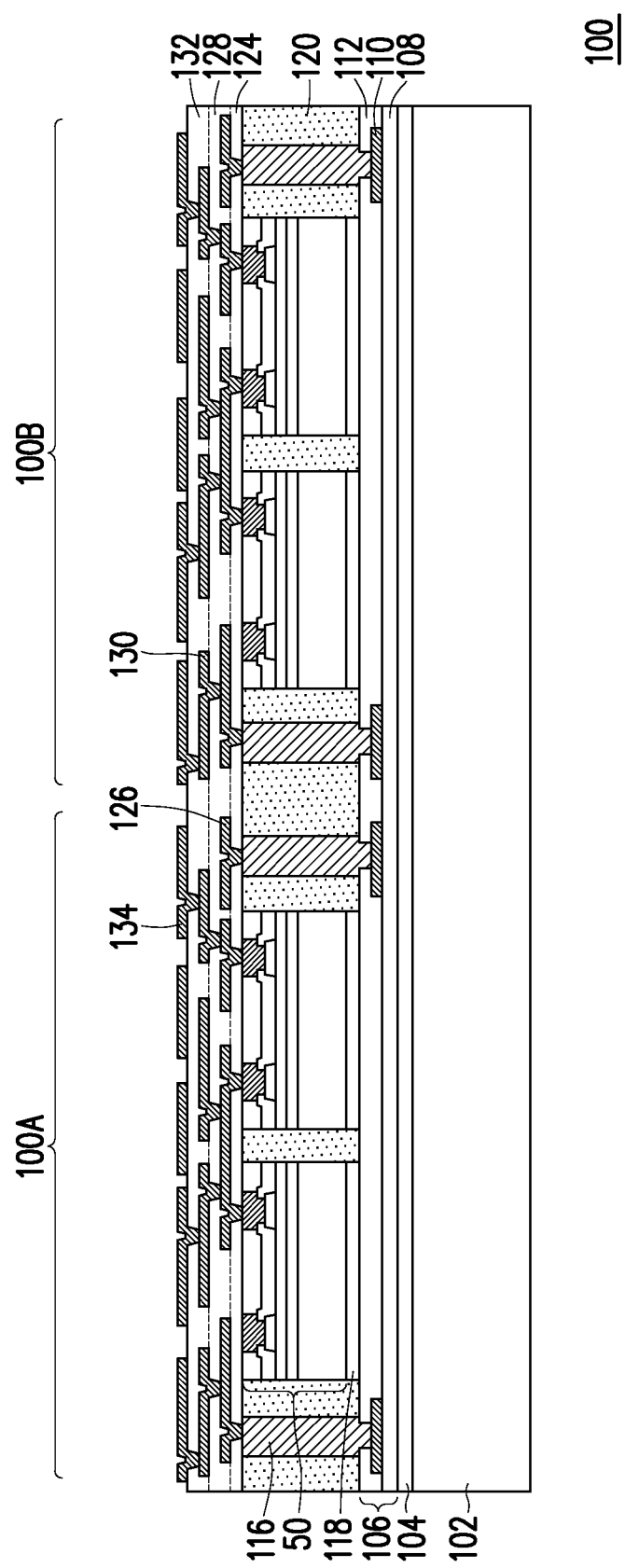

In FIG. 10, the dielectric layer 132 is deposited on the metallization pattern 130 and dielectric layer 128. The dielectric layer 132 may be formed in a manner similar to the dielectric layer 124, and may be formed of a similar material as the dielectric layer 124.

The metallization pattern 134 is then formed. The metallization pattern 134 includes line portions on and extending along the major surface of the dielectric layer 132. The metallization pattern 134 further includes via portions extending through the dielectric layer 132 to physically and electrically couple the metallization pattern 130. The metallization pattern 134 may be formed in a similar manner and of a similar material as the metallization pattern 126. The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the integrated circuit dies 50. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 11:
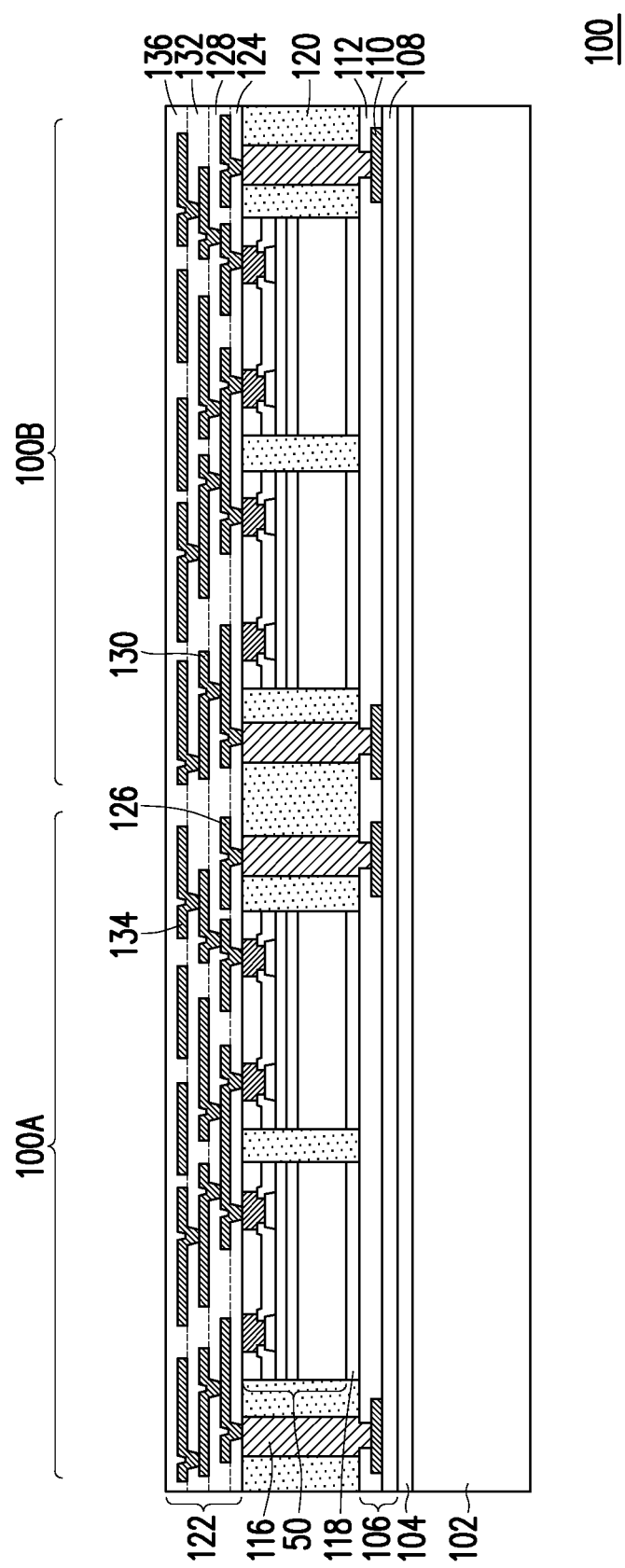

In FIG. 11, the dielectric layer 136 is deposited on the metallization pattern 134 and dielectric layer 132. The dielectric layer 136 may be formed in a manner similar to the dielectric layer 124, and may be formed of the same material as the dielectric layer 124. The dielectric layer 136 is the topmost dielectric layer of the front-side redistribution structure 122. As such, all of the metallization patterns of the front-side redistribution structure 122 (e.g., the metallization patterns 126, 130, and 134) are disposed between the dielectric layer 136 and the integrated circuit dies 50. Further, all of the intermediate dielectric layers of the front-side redistribution structure 122 (e.g., the dielectric layers 124, 128, 132) are disposed between the dielectric layer 136 and the integrated circuit dies 50.

Figure 12:
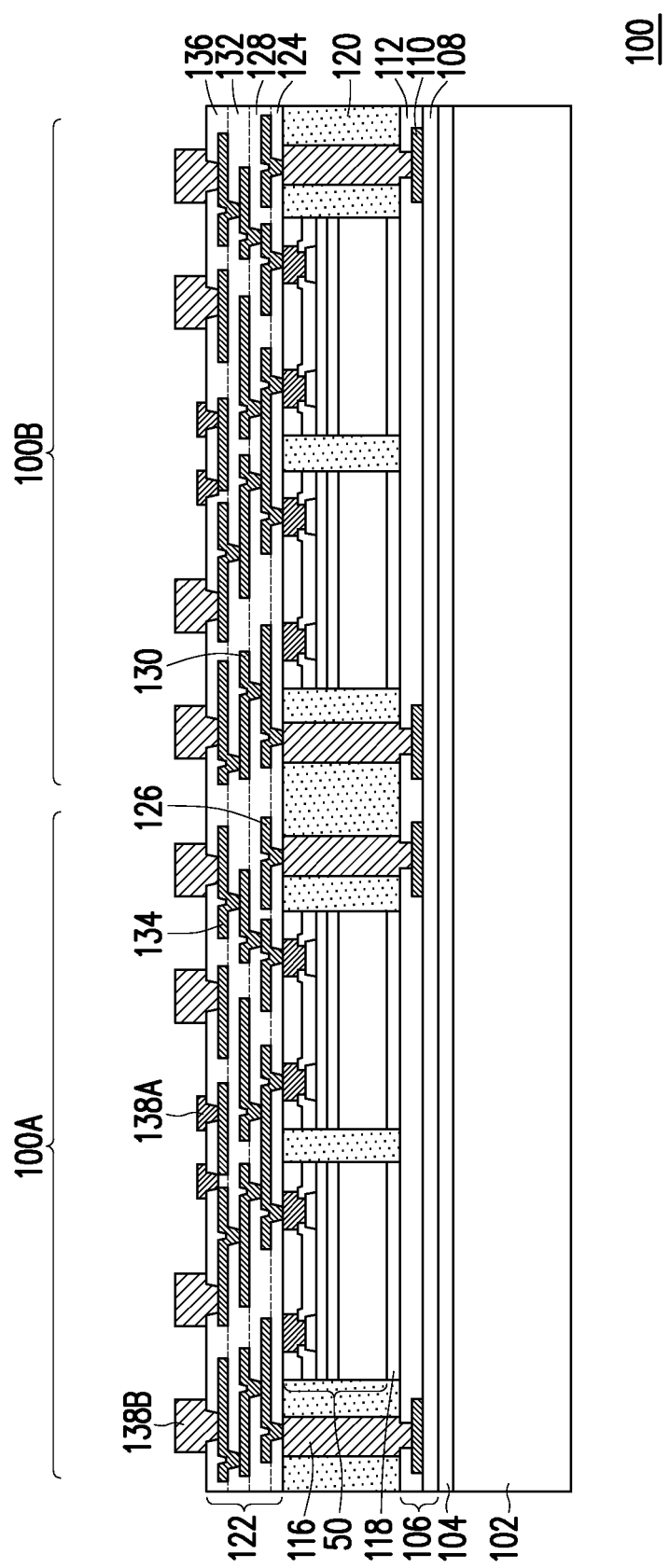

In FIG. 12, the pads 138A and 138B are formed on and extending through the dielectric layer 136. As an example to form the pads 138A and 138B, the dielectric layer 136 may be patterned to form openings exposing portions of the metallization pattern 134. The patterning may be by an acceptable process, such as by exposing the dielectric layer 136 to light when the dielectric layer 136 is a photo-sensitive material or by etching using, for example, an anisotropic etch. If the dielectric layer 136 is a photo-sensitive material, the dielectric layer 136 can be developed after the exposure. The openings for the pads 138A and 138B may be wider than the openings for the conductive via portions of the metallization patterns 126, 130, and 134. A seed layer is formed over the dielectric layer 136 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the pads 138A and 138B. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the pads 138A and 138B. In embodiments where the pads 138A and 138B are formed differently, more photoresist and patterning steps may be utilized.

In the embodiment shown, the pads 138A are larger than the pads 138B. For example, the pads 138A can have a width in range of 30 about μm to about 1000 μm, and the pads 138B can have a width in range of 100 about μm to about 760 μm. In another embodiment, the pads 138A can be smaller than the pads 138B. The pads 138A may be used to couple to surface-mounted passive devices 146 (see FIG. 14), and the pads 138B may be used to couple to conductive connectors 164 (see FIG. 17). It should be appreciated that the pads 138A and 138B could be a variety of connection types and sizes. Further, the pads 138A and 138B could be the same size. In some embodiments, the pads 138A are micro bumps and the pads 138B are under bump metallurgies (UBMs). The pads 138A and 138B may be formed in different processes. For example, a first photoresist may be formed having a pattern for the pads 138A, a first plating process may be performed in the pattern of the first photoresist, and the first photoresist may be removed. A second photoresist may then be formed having a pattern for the pads 138B, a second plating process may be performed in the pattern of the second photoresist, and the second photoresist may be removed.

Figure 13:
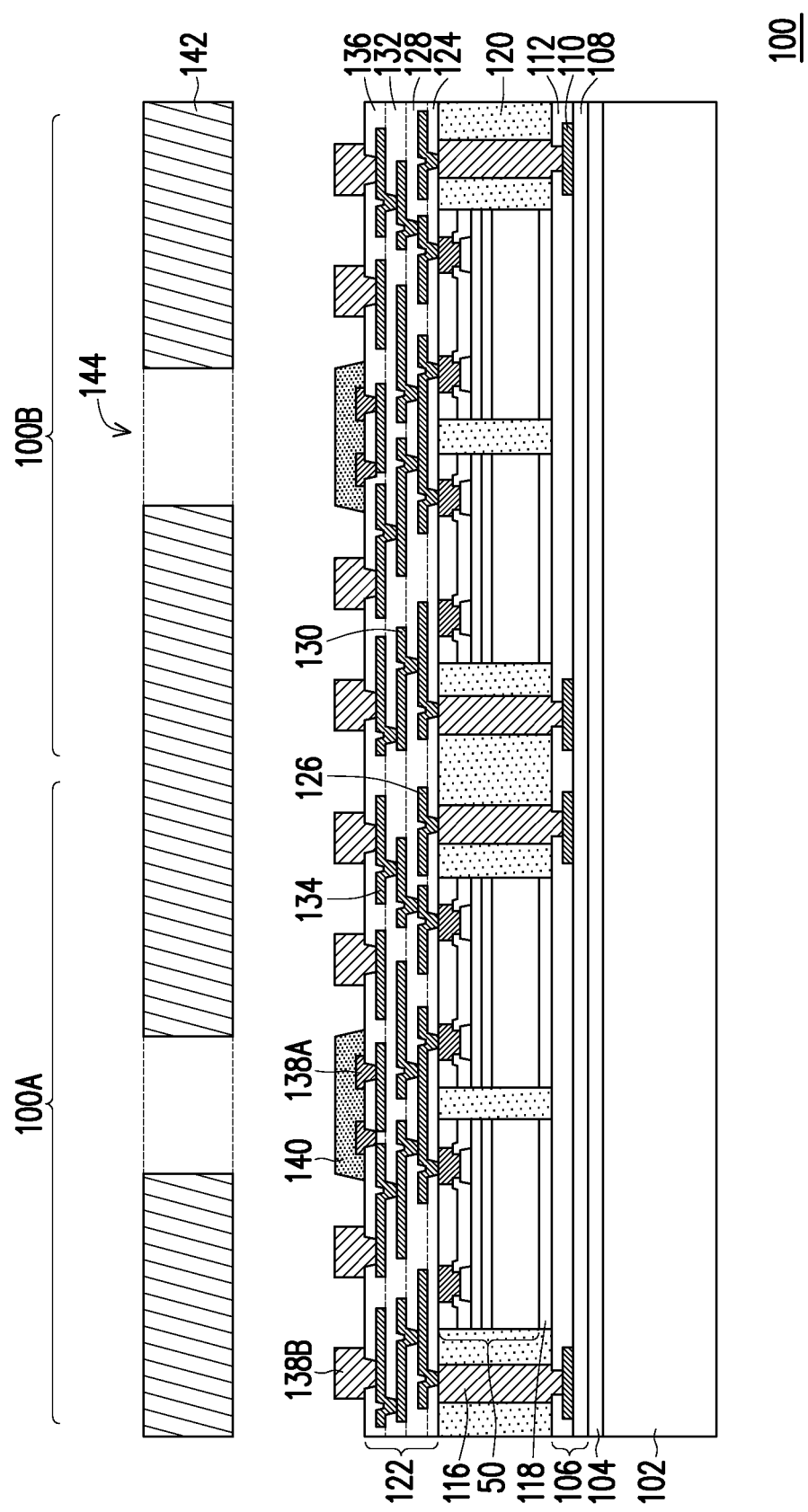

In FIG. 13, protective structures 140 are formed on and around the pads 138A. In the embodiment shown, the protective structures 140 are each a single continuous material, and are formed from an epoxy flux. In another embodiment, the protective structures 140 can comprise multiple layers of material. An epoxy flux is a polymeric material that includes a flux for forming conductive connectors, and also includes a resin for encapsulating and protecting the conductive connectors after formation. The resin may be an epoxy-based resin, a phenol-based resin, or the like. The flux may be hydrochloric acid, phosphoric acid, citric acid, hydrobromic acid, a carboxylic acid, an amino acid, a salt of a mineral acid with amines, or the like. Forming the protective structures 140 from an epoxy flux obviates the use of a flux when devices are subsequently attached to the pads 138A. The protective structures 140 may be formed by printing, jetting, or dispensing the epoxy flux on the pads 138A with (or without) a stencil 142. The stencil 142 has openings 144 corresponding to target regions where the epoxy flux will be dispensed. The use of preformed protective structures 140 also obviates the need for molding an underfill beneath subsequently attached devices. The protective structures 140 may be printed with the stencil 142 quicker than a capillary flow process for forming an underfill. Processing time for forming the first package component 100 may thus be reduced. Further, the epoxy flux is not cured immediately after being dispensed. Rather, the curing process is delayed and is performed concurrently with a reflow process for subsequently formed reflowable materials. One or more thermal processing steps may thus be omitted, and the uncured protective structures 140 are viscous such that they may be easily molded and used as an adhesive during processing.

Figure 14:
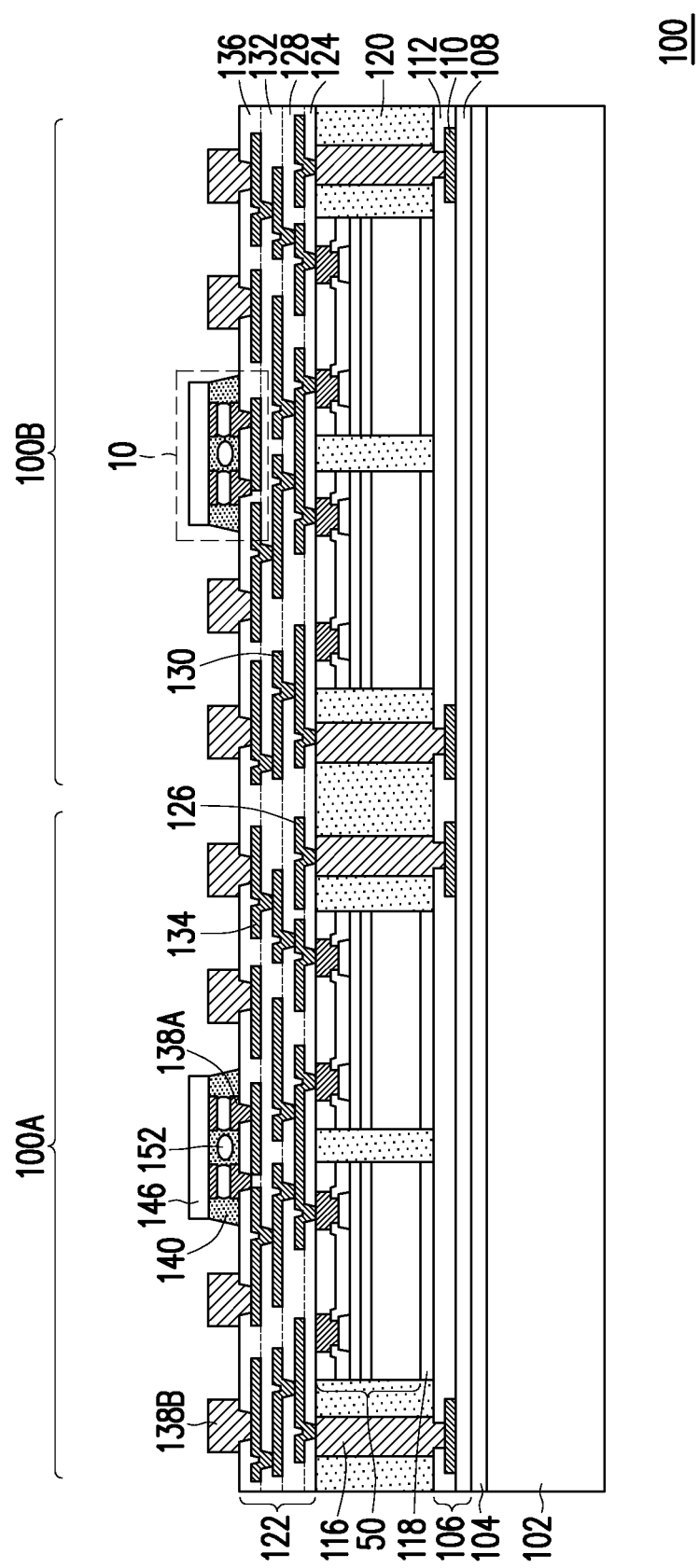
Figure 15A:
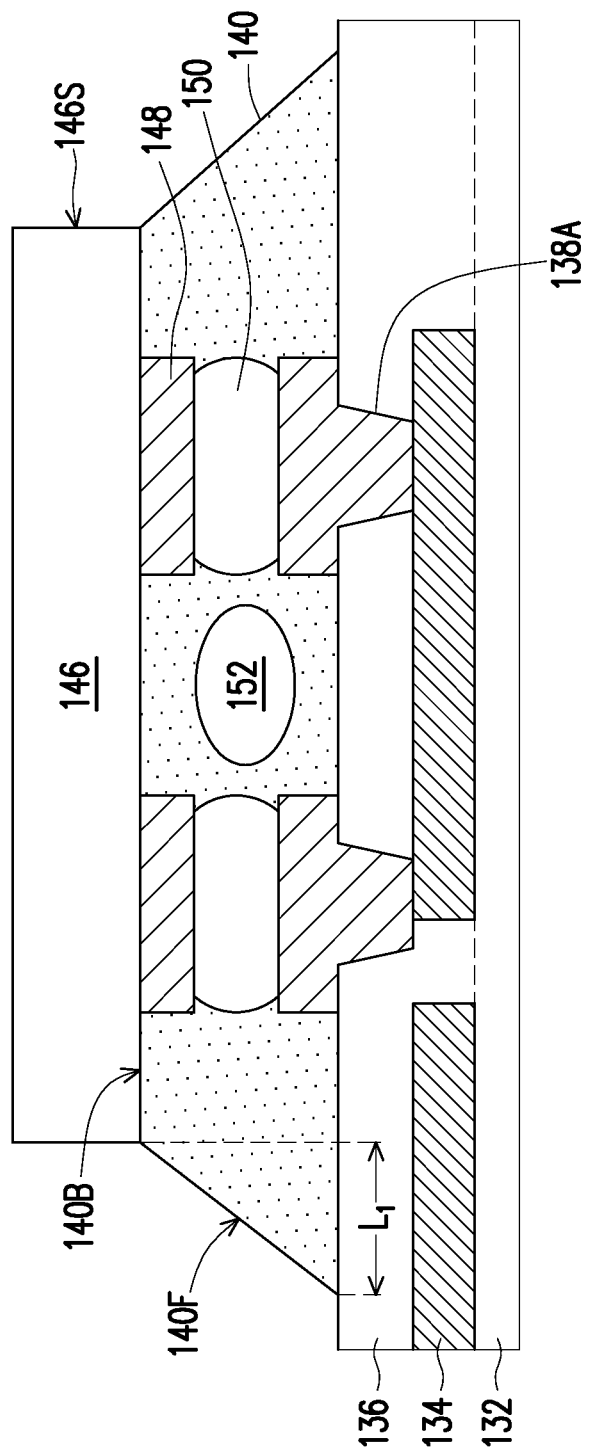
FIGS. 15A, 15B, 15C, and 15D illustrate cross-sectional views of a passive device, in accordance with some embodiments.
Figure 15B:
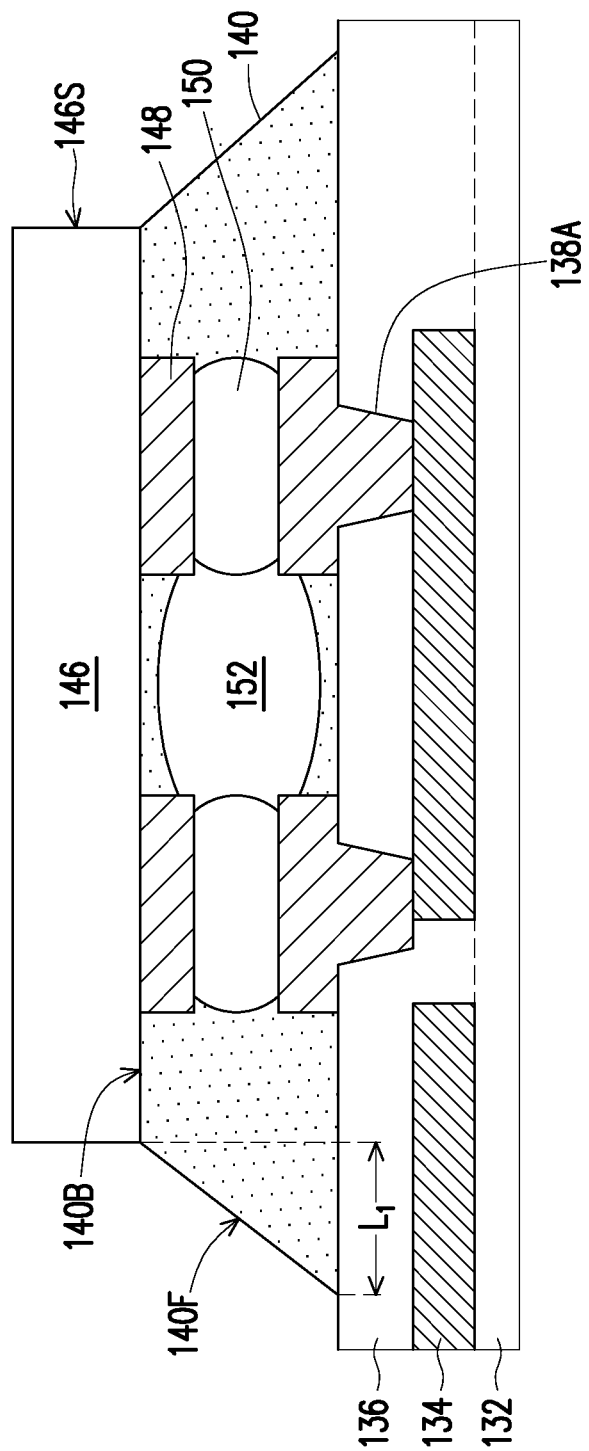
Figure 15C:
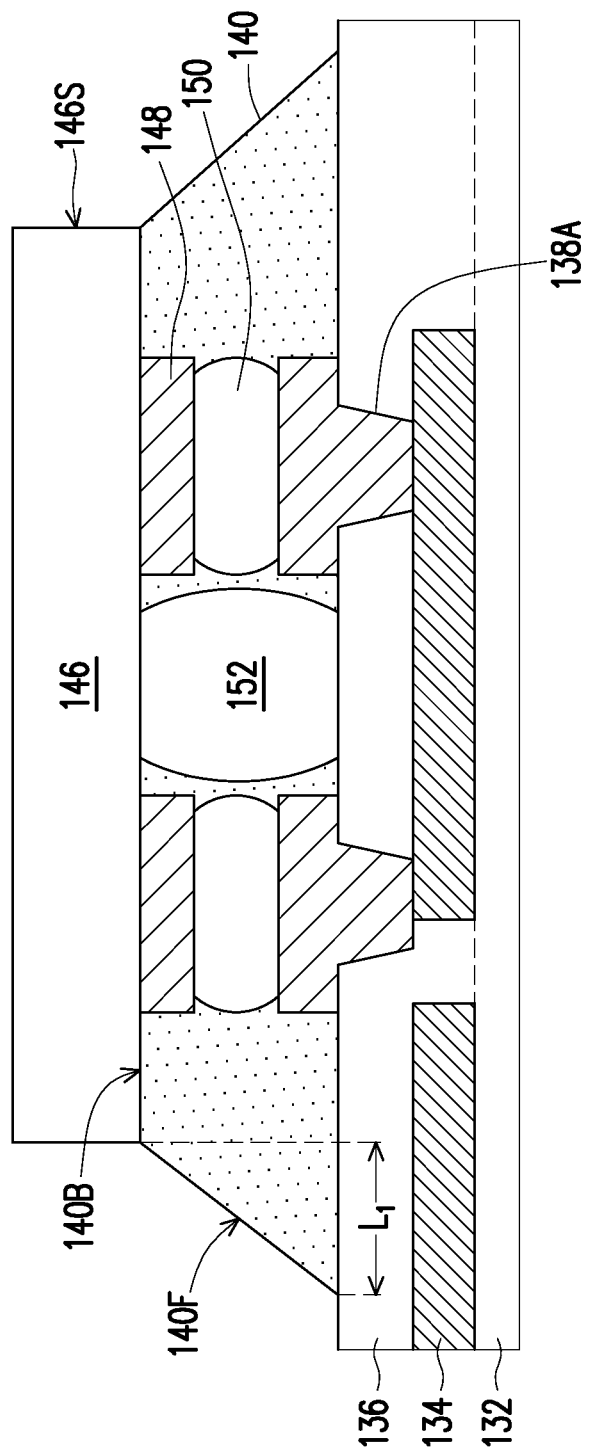
Figure 15D:
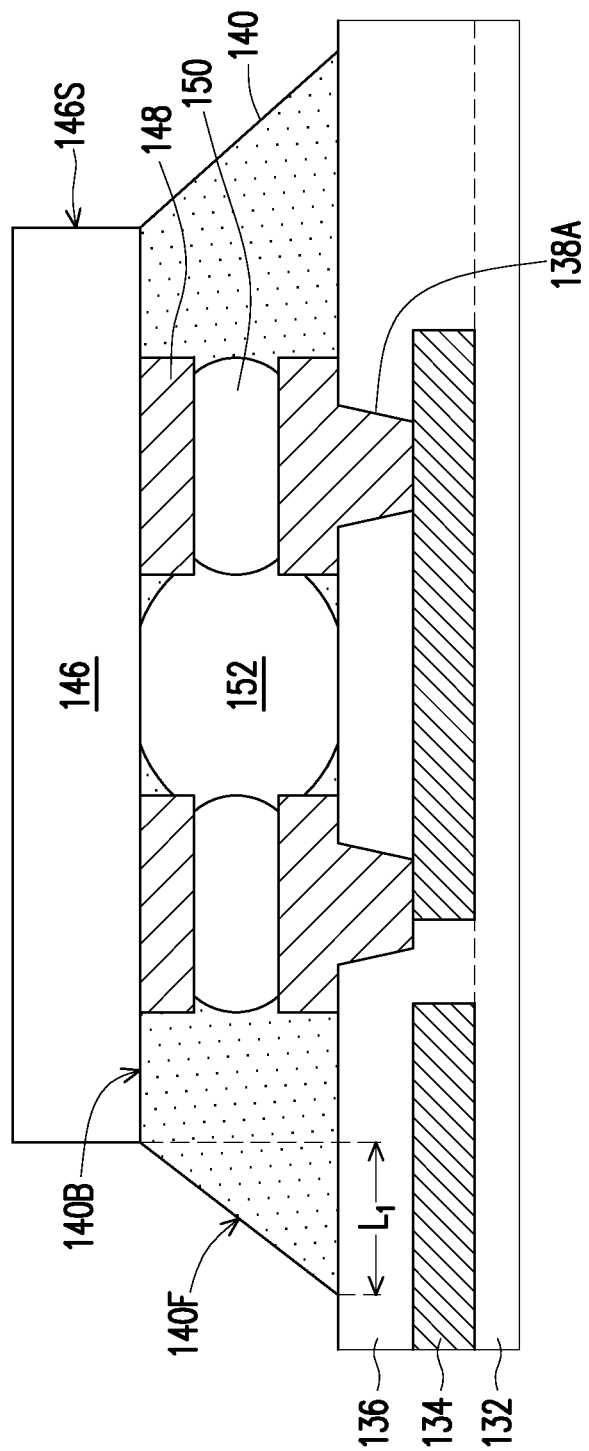

In FIG. 14, passive devices 146 are attached to the pads 138A. FIGS. 15A through 15D are detailed views of a region 10 of the first package component 100, in accordance with various embodiments. FIGS. 15A through 15D illustrate additional details of the passive devices 146, and are described in conjunction with FIG. 14. The passive devices 146 include one or more passive devices in a main structure of the passive devices 146. The main structure could include a substrate and/or encapsulant. In the embodiments including a substrate, the substrate could be a semiconductor substrate, such as silicon, doped or undoped, or an active layer of a SOI substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The passive devices may include a capacitor, resistor, inductor, the like, or a combination thereof. The passive devices may be formed in and/or on the semiconductor substrate and/or within the encapsulant and may be interconnected by interconnect structures formed by, for example, metallization patterns in one or more dielectric layers on the main structure to form the passive devices 146. The passive devices 146 may be surface mount devices (SMDs), 2-terminal integrated passive devices (IPDs), multi-terminal IPDs, or other types of passive devices. Pads 148 are formed on and coupled to the passive devices 146, to which external connections are made. The pads 148 may be, e.g., micro bumps. Conductive connectors 150 are formed on ends of the pads 148 and comprise, e.g., a reflowable material. The conductive connectors 150 may also be referred to as reflowable connectors.

The passive devices 146 may be attached to the front-side redistribution structure 122 using, for example, a pick-and-place tool. The pads 138A and 148 are aligned during placement. The passive devices 146 are pressed in the uncured protective structures 140, such that the pads 148 and conductive connectors 150 extend into and are surrounded by the uncured protective structures 140. The uncured protective structures 140 adhere the passive devices 146 to the front-side redistribution structure 122. The uncured protective structures 140 may not extend along sidewalls 146S of the passive devices 146, e.g., the sidewalls 146S of the passive devices 146 may be free from the material of the uncured protective structures 140. The protective structures 140 have a main body 140B and fillets 140F. As noted above, the curing process for the protective structures 140 is delayed and combined with a subsequent reflow step. By omitting a thermal processing step at this stage of processing, the fillets 140F of the protective structures 140 may be shortened. In some embodiments, the fillets 140F have a length $L_1$ in the range from about 1 µm to about 200 µm. By reducing the length $L_1$ of the fillets 140F, the minimum spacing between adjacent passive devices 146 (or adjacent pads 138B) may be reduced by up to 200 µm. In some embodiments, the spacing between adjacent passive devices 146 (or adjacent pads 138B) is in the range from about 100 µm to about 600 µm, such as about 150 µm. The overall footprint of the passive devices 146 may thus be reduced, thereby improving the circuit routing of the front-side redistribution structure 122.

The viscous material of the uncured protective structures 140 has a high surface tension, and as such, voids 152 may be formed between adjacent ones of the conductive connectors 150 during placement. In some embodiments (e.g., FIG. 15A), the protective structures 140 separate the voids 152 from the passive devices 146, the dielectric layer 136, the conductive connectors 150, and the pads 138A and 148. In some embodiments (e.g., FIG. 15B), the protective structures 140 separate the voids 152 from the passive devices 146 and the dielectric layer 136, and the voids 152 expose surfaces of the conductive connectors 150 and the pads 138A and 148. In some embodiments (e.g., FIG. 15C), the protective structures 140 separate the voids 152 from the conductive connectors 150 and the pads 138A and 148, and the voids 152 expose surfaces of the passive devices 146 and the dielectric layer 136. In some embodiments (e.g., FIG. 15D), the voids 152 expose surfaces of the passive devices 146, the dielectric layer 136, the conductive connectors 150, and the pads 138A and 148.

Although FIGS. 15A through 15D illustrate the protective structures 140 as each having a single void 152, it should be appreciated that the protective structures 140 may each have multiple voids 152. Further, although FIGS. 15A through 15D illustrate the single void 152 as being in the center of each protective structure 140, it should be appreciated that the voids 152 may be disposed in other locations. For example, the voids 152 may be disposed in the centers of the protective structures 140, or along edges of the protective structures 140.

Figure 16:
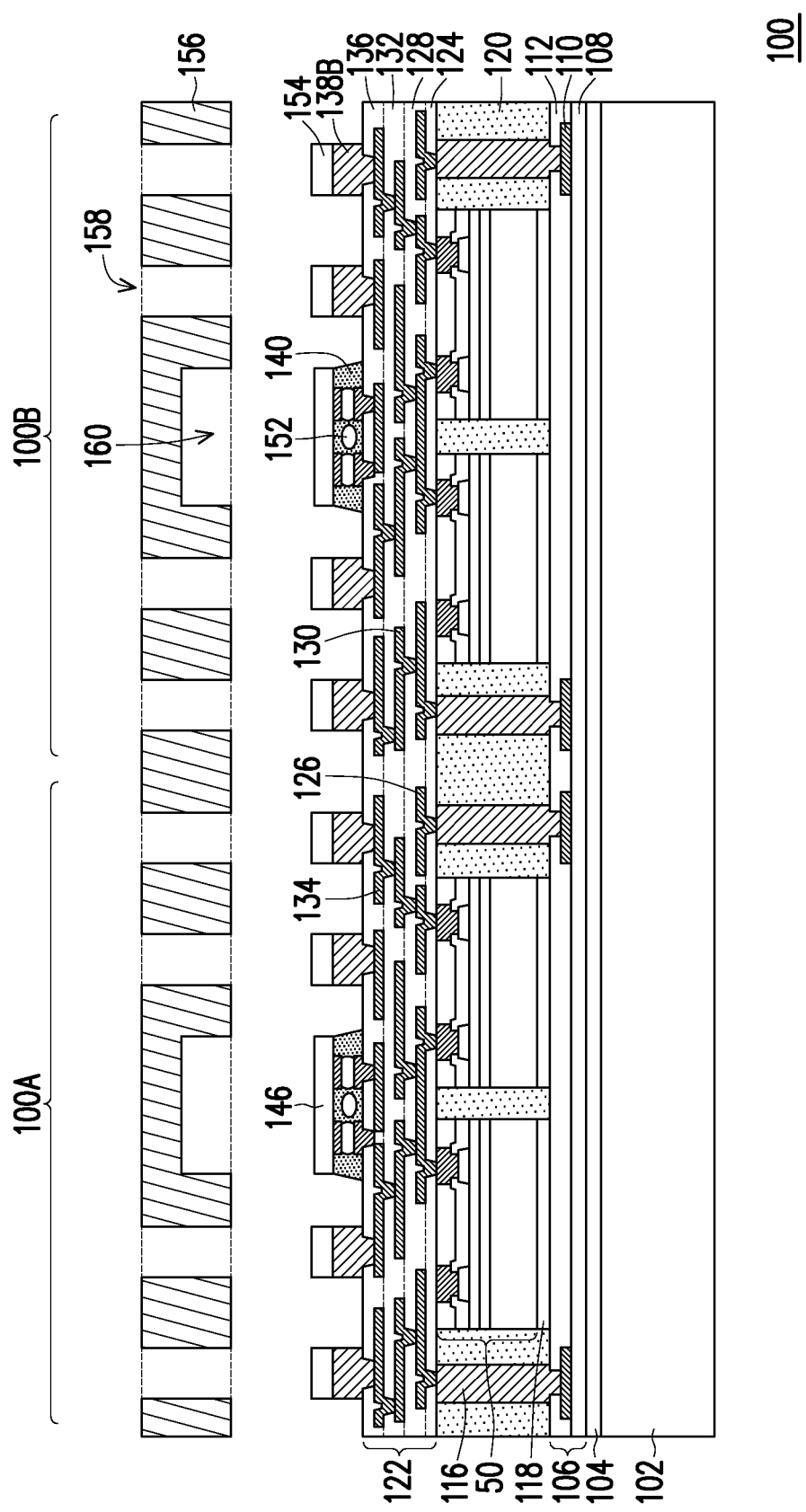

In FIG. 16, flux 154 is formed on the pads 138B. The flux 154 is formed during a cleaning process for deoxidizing surfaces of the pads 138B. The flux 154 is different from the epoxy flux of the protective structures 140. For example, the flux 154 may be a non-epoxy flux. In some embodiments, the flux 154 is water, hydrochloric acid, phosphoric acid, citric acid, hydrobromic acid, a carboxylic acid, an amino acid, a salt of a mineral acid with amines, or the like. The flux 154 may be dispensed on the pads 138B with a stencil 156. The stencil 156 has openings 158 corresponding to target regions where the flux 154 will be dispensed (e.g., corresponding to the pattern of the pads 138B). The stencil 156 also has recesses 160 corresponding to the passive devices 146. The recesses 160 of the stencil 156 cover the passive devices 146 during the cleaning process, such that the passive devices 146 are disposed in the recesses 160 and protected (e.g., not contacted by the flux 154) during the flux dispensing process.

Figure 17:
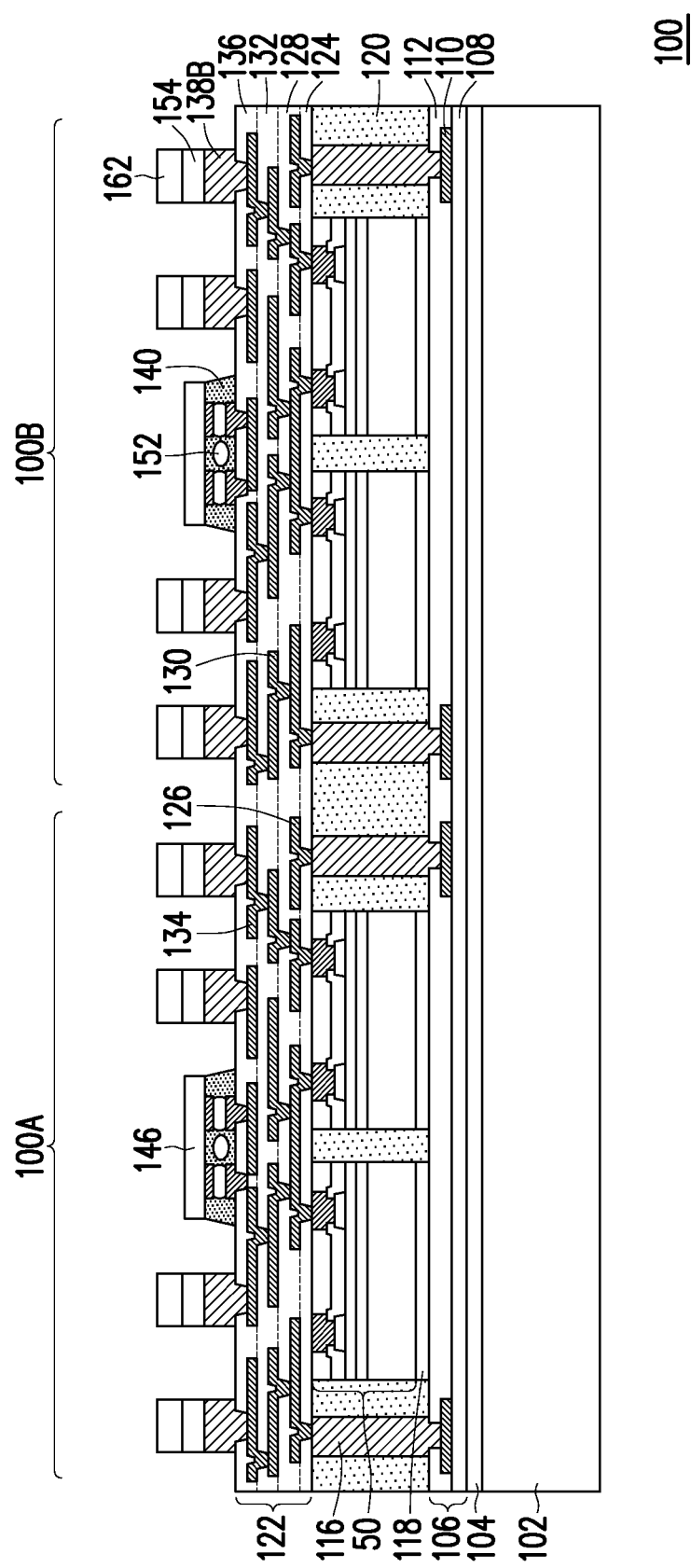

In FIG. 17, reflowable material 162 is formed on the flux 154. The reflowable material 162 may include solder, copper, aluminum, gold, nickel, silver, palladium, tin, the like, or a combination thereof. In some embodiments, the reflowable material 162 is solder, which may be formed by methods such as evaporation, electroplating, printing, solder transfer, ball placement, or the like. In some embodiments, a repair process is performed after the reflowable material 162 is formed. During the repair process, defective or missing reflowable material 162 is identified and replaced. The reflowable material 162 may also be referred to as reflowable connectors.

Figure 18:
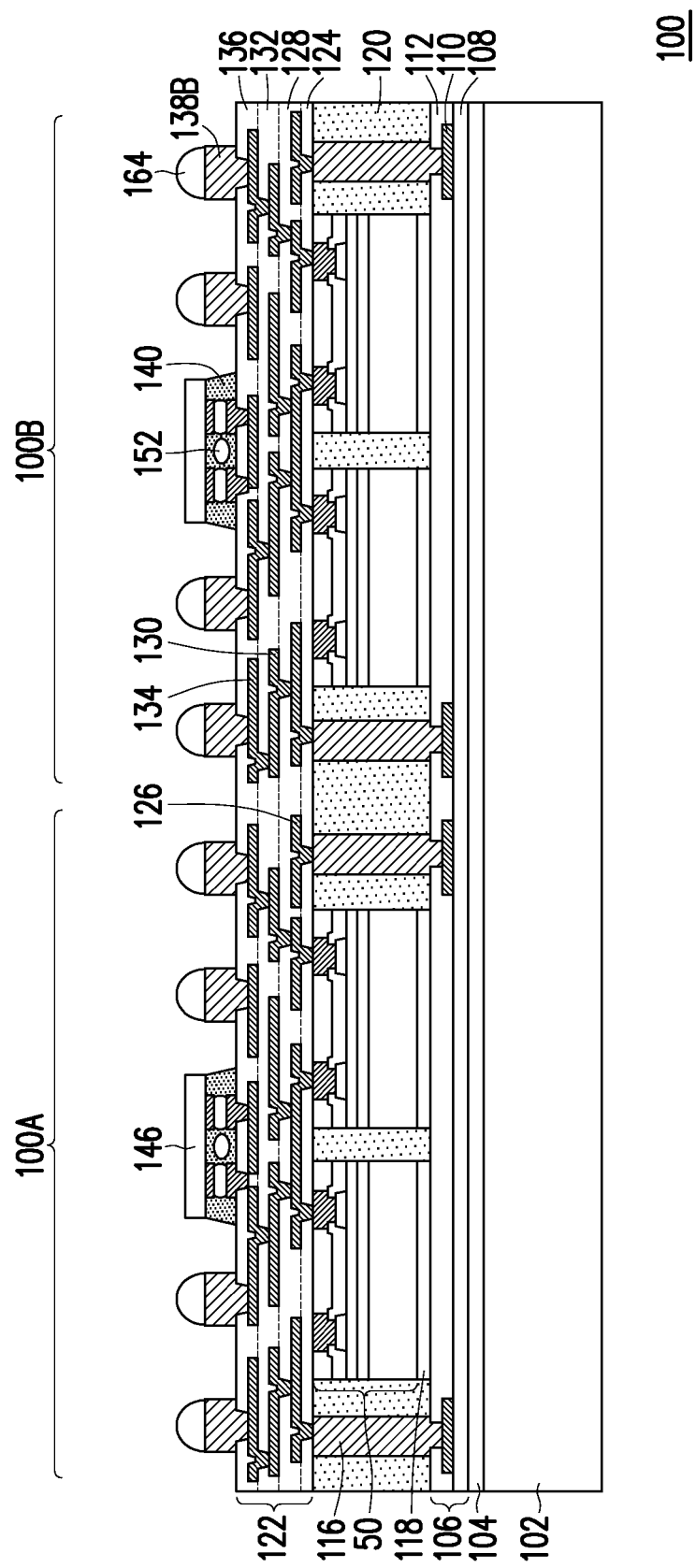

In FIG. 18, conductive connectors 164 are formed on the pads 138B by reflowing the reflowable material 162. The resulting conductive connectors 164 may be ball grid array (BGA) connectors, solder balls, or the like. In some embodiments, a single thermal processing step is performed to simultaneously cure the protective structures 140, reflow the conductive connectors 150, and reflow the reflowable material 162. Details about the thermal processing step are discussed further below with respect to FIG. 19. After the thermal processing step, the conductive connectors 150 physically and electrically couple the passive devices 146 to the front-side redistribution structure 122. Further, the reflowable material 162 is shaped into desired bump shapes by the thermal processing step, thus forming the conductive connectors 164. The flux 154 may be burned and/or evaporated during the thermal processing step, thereby removing the flux 154. Finally, the protective structures 140 are cured by the thermal processing step, allowing separate curing processes (e.g., subsequent to the reflow) to be omitted. The cured protective structures 140 protect the conductive connectors 150 and the pads 138A and 148, obviating the need for forming an underfill beneath the passive devices 146. A molding step for the underfill and a curing step for the underfill may thus be eliminated, thereby reducing processing time for forming the first package component 100. Manufacturing costs may thus be reduced.

Figure 19:
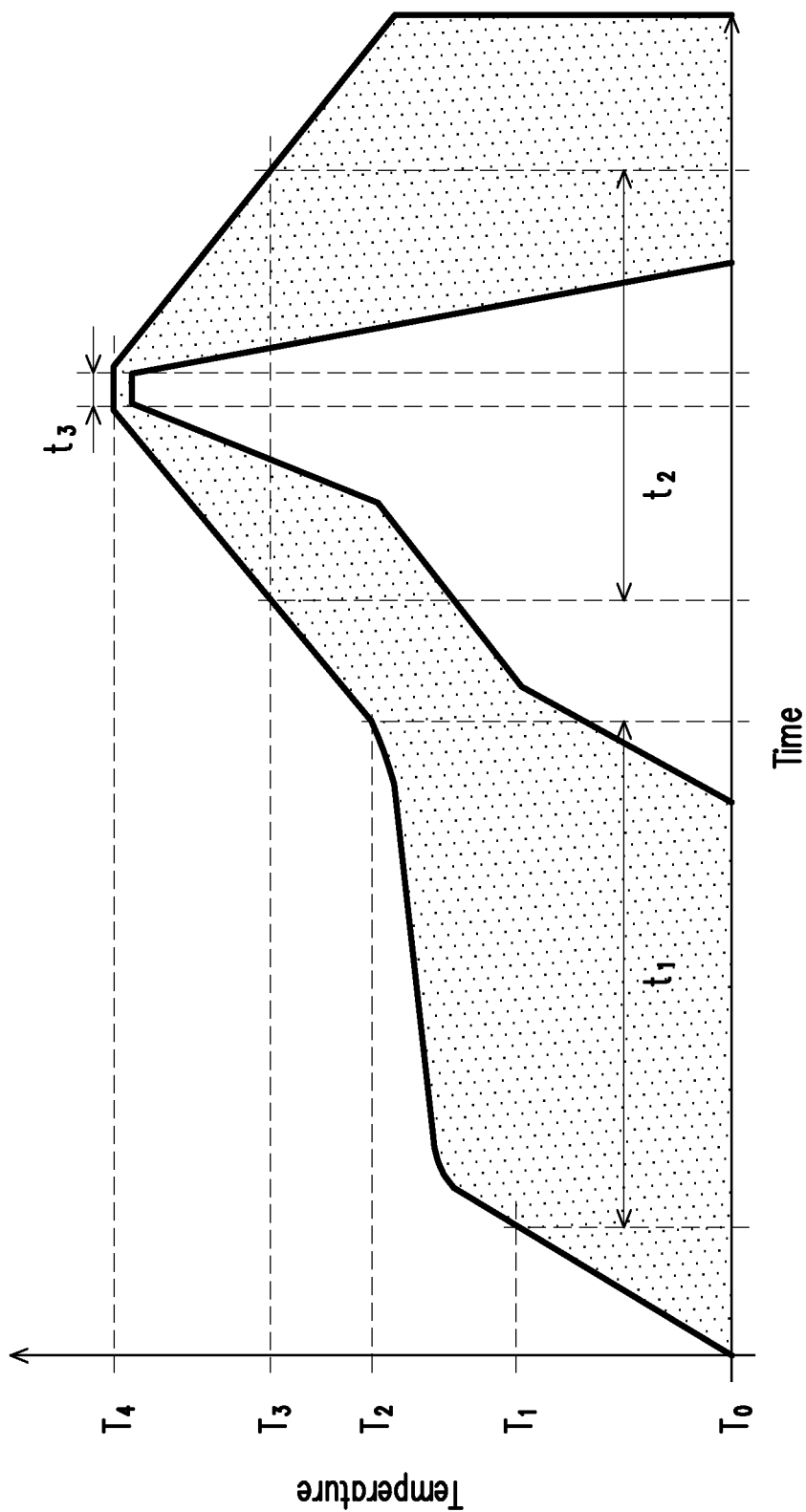
FIG. 19 is a graph illustrating aspects of a thermal processing step, in accordance with some embodiments.

FIG. 19 is a graph illustrating the temperature and duration of the thermal processing step, in accordance with some embodiments. The thermal processing step is performed at several different temperatures. First, the temperature is increased from an initial temperature $T_0$ (e.g., room temperature) to a first temperature $T_1$ of about 150° C. The temperature is then increased to a second temperature $T_2$ of about 200° C., over a time period $t_1$ of from about 30 seconds to about 180 seconds. The increase from $T_1$ to $T_2$ can be non-linear. The temperature is then further increased to a temperature $T_3$ of about 217° C., and even further increased to a temperature $T_4$ of about 260° C. Reflow of the reflowable material 162 occurs between 217° C. and 260° C. and curing of the protective structures 140 occurs during the reflow process. The temperature is maintained above the minimum reflow temperature $T_3$ for a total time period $t_2$ of from about 30 seconds to about 150 seconds, with the temperature being maintained at the maximum reflow temperature $T_4$ for a maximum time period $t_3$ of from about 20 seconds to about 100 seconds. The temperature is then decreased back to the initial temperature $T_0$ as the reflowable material 162 cools. The rate of increase from the minimum reflow temperature $T_3$ to the maximum reflow temperature $T_4$ can be up to about 3° C./second, and the rate of decrease from the maximum reflow temperature $T_4$ to the minimum reflow temperature $T_3$ can be up to about 6° C./second. The total amount of elapsed time between the initial temperature and the maximum reflow temperature $T_4$ can be up to about 8 minutes.

Figure 20:
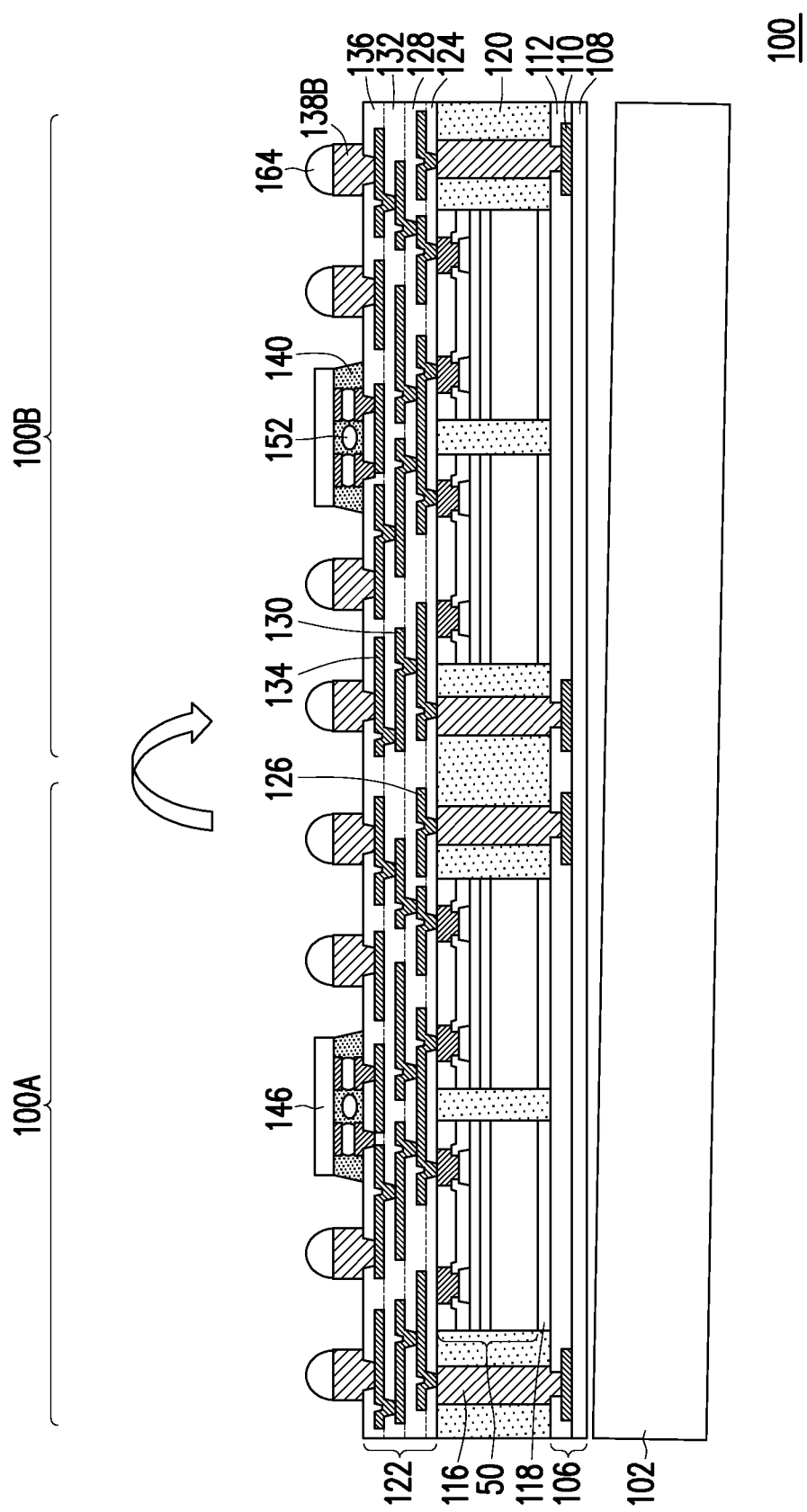

In FIG. 20, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape.

Figure 21:
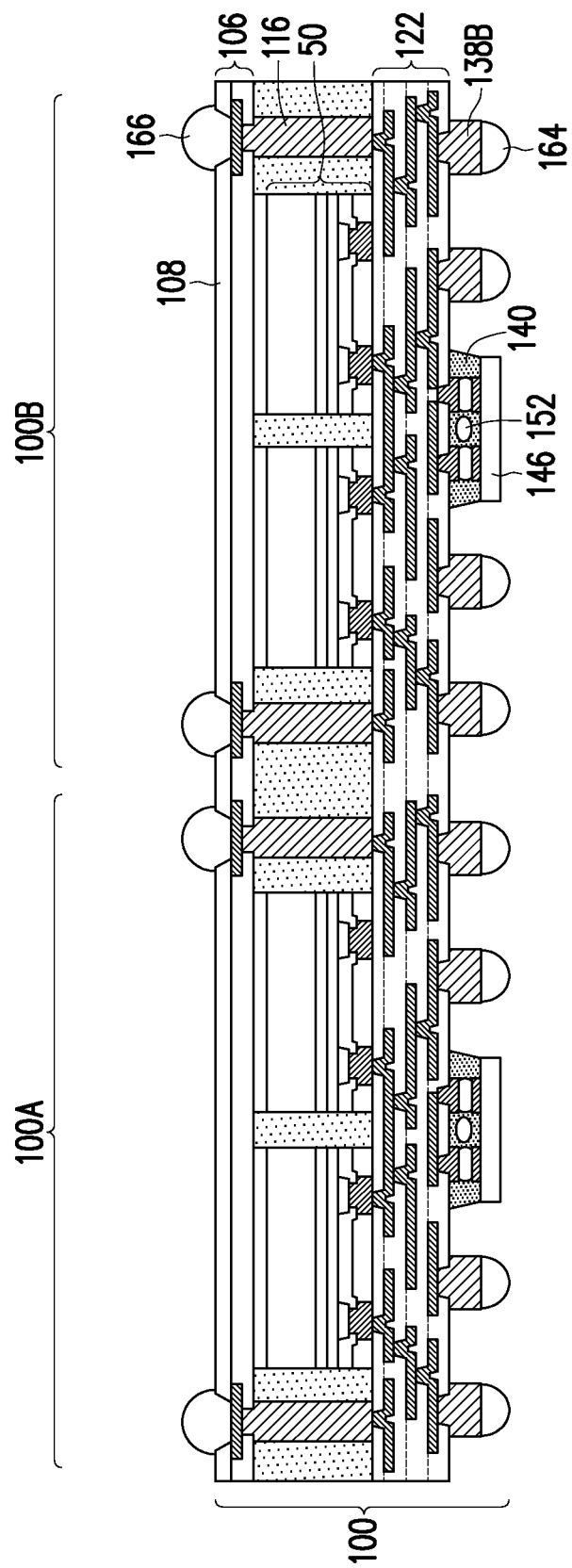

In FIG. 21, conductive connectors 166 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 166 are formed in the openings. In some embodiments, the conductive connectors 166 comprise flux and are formed in a flux dipping process. In some embodiments, the conductive connectors 166 comprise a conductive paste such as solder paste, silver paste, or the like, and are dispensed in a printing process. In some embodiments, the conductive connectors 166 are formed in a manner similar to the conductive connectors 164, and may be formed of the same material as the conductive connectors 164.

Figure 22:
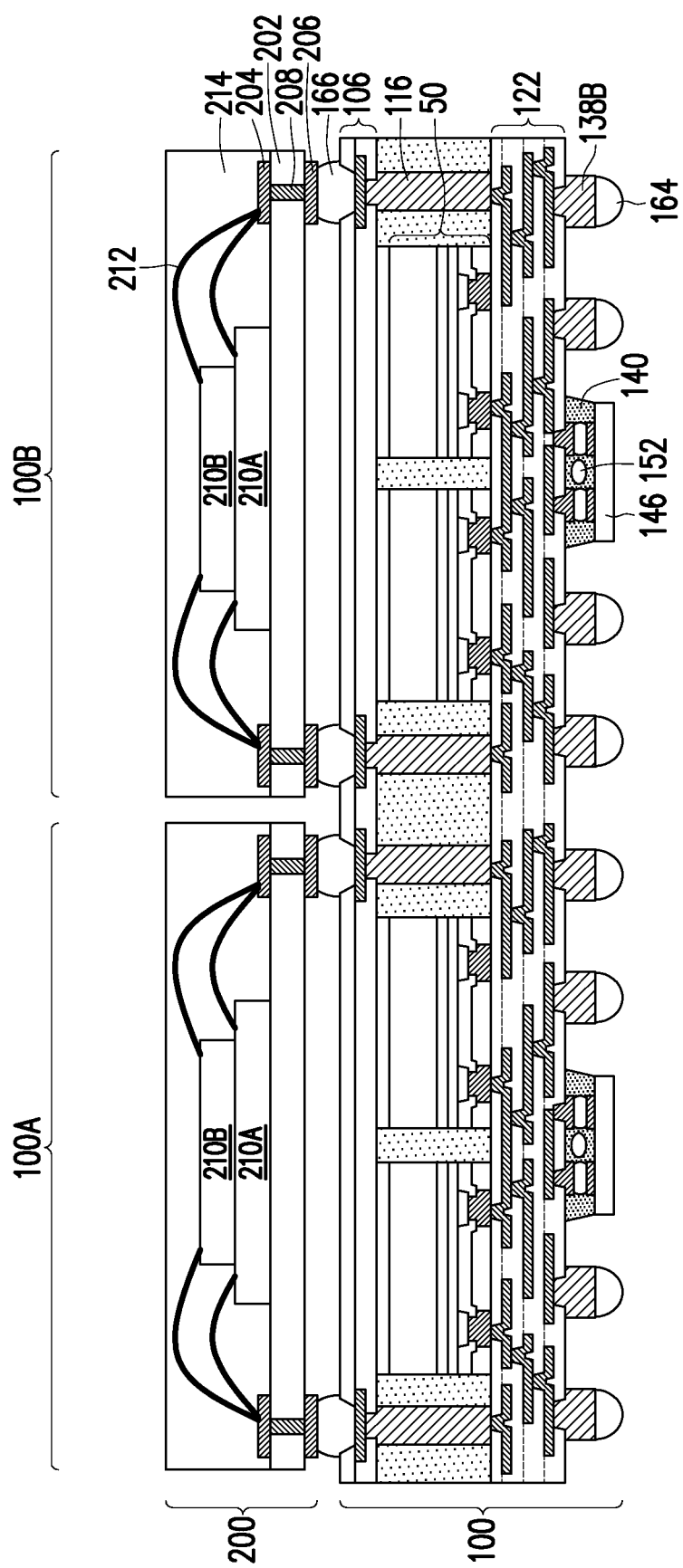
FIGS. 22 and 23 illustrate formation and implementation of device stacks, in accordance with some embodiments.
Figure 23:
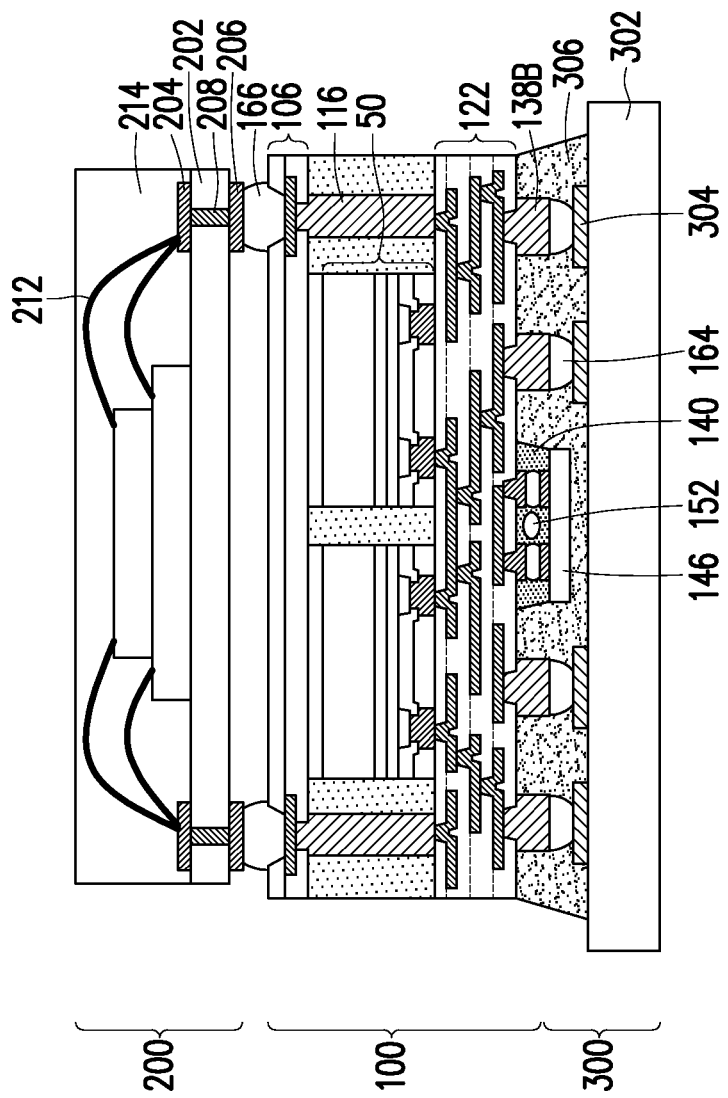

FIGS. 22 and 23 illustrate formation and implementation of device stacks, in accordance with some embodiments. The device stacks are formed from the integrated circuit packages formed in the first package component 100. The device stacks may also be referred to as package-on-package (PoP) structures.

In FIG. 22, second package components 200 are coupled to the first package component 100. One of the second package components 200 are coupled in each of the package regions 100A and 100B to form an integrated circuit device stack in each region of the first package component 100.

The second package components 200 include a substrate 202 and one or more dies coupled to the substrate 202. In the illustrated embodiment, the dies include stacked dies 210A and 210B. In some embodiments, the dies (or die stacks) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and conductive vias 208. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210A and 210B, and bond pads 206 on a second side of the substrate 202, the second side being opposite the first side of the substrate 202, to couple to the conductive connectors 166. In some embodiments, the bond pads 204 and 206 are formed by forming recesses into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer made of copper, titanium, nickel, gold, palladium, the like, or a combination thereof. The conductive material of the bond pads 204 and 206 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In an embodiment, the bond pads 204 and bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210A and 210B are coupled to the substrate 202 by wire bonds 212, although other connections may be used, such as conductive bumps. In an embodiment, the stacked dies 210A and 210B are stacked memory dies. For example, the stacked dies 210A and 210B may be memory dies such as low-power (LP) double data rate (DDR) memory modules, such as LPDDR1, LPDDR2, LPDDR3, LPDDR4, or the like memory modules.

The stacked dies 210A and 210B and the wire bonds 212 may be encapsulated by a molding material 214. The molding material 214 may be molded on the wire bonds 212 and the stacked dies 210A and 210B, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the wire bonds 212 and the stacked dies 210A and 210B are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package component 100 by way of the conductive connectors 166, the bond pads 206, and the back-side redistribution structure 106. In some embodiments, the stacked dies 210A and 210B may be coupled to the integrated circuit dies 50 through the wire bonds 212, the bond pads 204 and 206, conductive vias 208, the conductive connectors 166, the back-side redistribution structure 106, the through vias 116, and the front-side redistribution structure 122.

In some embodiments, a solder resist is formed on the side of the substrate 202 opposing the stacked dies 210A and 210B. The conductive connectors 166 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 166 have an epoxy flux formed thereon before they are reflowed with at least some of the epoxy portion of the epoxy flux remaining after the second package components 200 are attached to the first package component 100.

In some embodiments, an underfill is formed between the first package component 100 and the second package components 200, surrounding the conductive connectors 166. The underfill may reduce stress and protect the joints resulting from the reflowing of the conductive connectors 166. The underfill may be formed by a capillary flow process after the second package components 200 are attached, or may be formed by a suitable deposition method before the second package components 200 are attached. In embodiments where the epoxy flux is formed, it may act as the underfill.

In FIG. 23, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. In some embodiments, the singulation process is performed after the second package components 200 are coupled to the first package component 100. In other embodiments, the singulation process is performed before the second package components 200 are coupled to the first package component 100, such as after the carrier substrate 102 is de-bonded and the conductive connectors 166 are formed.

Each singulated first package component 100 is then mounted to a package substrate 300 using the conductive connectors 164. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be a SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). As one of ordinary skill in the art will recognize, a wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 164 are reflowed to attach the first package component 100 to the bond pads 304. The conductive connectors 164 electrically and/or physically couple the package substrate 300, including metallization layers in the substrate core 302, to the first package component 100. In some embodiments, a solder resist is formed on the substrate core 302. The conductive connectors 164 may be disposed in openings in the solder resist to be electrically and mechanically coupled to the bond pads 304. The solder resist may be used to protect areas of the substrate 202 from external damage.

The conductive connectors 164 may have an epoxy flux formed thereon before they are reflowed with at least some of the epoxy portion of the epoxy flux remaining after the first package component 100 is attached to the package substrate 300. This remaining epoxy portion may act as an underfill to reduce stress and protect the joints resulting from the reflowing the conductive connectors 164. In some embodiments, an underfill 306 may be formed between the first package component 100 and the package substrate 300 and surrounding the conductive connectors 164. The underfill 306 may be formed by a capillary flow process after the first package component 100 is attached or may be formed by a suitable deposition method before the first package component 100 is attached. The underfill 306 contacts surfaces of the surface-mounted passive devices 146 and protective structures 140.

In some embodiments, passive devices (e.g., surface mount devices (SMDs), not illustrated) may also be attached to the package substrate 300 (e.g., to the bond pads 304). For example, the passive devices may be bonded to a same surface of the first package component 100 or the package substrate 300 as the conductive connectors 164. The passive devices may be attached to the package component 100 prior to mounting the first package component 100 on the package substrate 300, or may be attached to the package substrate 300 prior to or after mounting the first package component 100 on the package substrate 300.

It should be appreciated that the first package component 100 may be implement in other device stacks. For example, a PoP structure is shown, but the first package component 100 may also be implemented in a Flip Chip Ball Grid Array (FCBGA) package. In such embodiments, the first package component 100 is mounted to a substrate such as the package substrate 300, but the second package component 200 is omitted. Instead, a lid or heat spreader may be attached to the first package component 100. When the second package component 200 is omitted, the back-side redistribution structure 106 and through vias 116 may also be omitted.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Dispensing the protective structures 140 before attachment of the passive devices 146 may obviate the need for an underfill, reducing the overall footprint of the passive devices 146. By curing the protective structures 140 and reflowing the reflowable material 162 in a same thermal processing step, one or more thermal processing steps may be omitted, thereby decreasing wafer processing time and manufacturing costs.

In an embodiment, a method includes: encapsulating an integrated circuit die with an encapsulant; forming a redistribution structure on the encapsulant, the redistribution structure being electrically connected to the integrated circuit die, the redistribution structure including a first pad and a second pad; dispensing an epoxy flux on the first pad to form a protective structure; prior to curing the epoxy flux, pressing a passive device into the protective structure to physically couple the passive device to the first pad; forming a first conductive connector on the second pad; and performing a single thermal process to simultaneously cure the protective structure and reflow the first conductive connector, the first conductive connector physically and electrically coupling the passive device to the first pad after the single thermal process.

In some embodiments, the method further includes: placing the integrated circuit die adjacent to a conductive via, the redistribution structure being electrically connected to the conductive via; and encapsulating the conductive via with the encapsulant. In some embodiments of the method, the passive device includes a second conductive connector, the passive device being pressed into the protective structure until the second conductive connector contacts the first pad, the second conductive connector including a reflowable material. In some embodiments of the method, performing the single thermal process reflows the second conductive connector. In some embodiments of the method, the protective structure has a void disposed between the passive device and the redistribution structure. In some embodiments of the method, the protective structure separates the void from the passive device, the redistribution structure, the second conductive connector, and the first pad. In some embodiments of the method, the protective structure separates the void from the passive device and the redistribution structure, and the void exposes surfaces of the second conductive connector and the first pad. In some embodiments of the method, the protective structure separates the void from the second conductive connector and the first pad, and the void exposes surfaces of the passive device and the redistribution structure. In some embodiments of the method, the void exposes surfaces of the second conductive connector, the first pad, the passive device, and the redistribution structure.

In an embodiment, a method includes: encapsulating an integrated circuit die with an encapsulant; depositing a first dielectric layer over the encapsulant and the integrated circuit die; forming a first metallization pattern extending along and through the first dielectric layer, the first metallization pattern electrically coupling the integrated circuit die; depositing a second dielectric layer over the first metallization pattern; forming a first pad and a second pad through the second dielectric layer, the first pad and the second pad electrically coupling the first metallization pattern; adhering a passive device to the first pad and the second dielectric layer with an epoxy flux, the passive device including a first reflowable connector, the first reflowable connector being physically and electrically coupled to the first pad after adhering the passive device; forming first flux on the second pad, the first flux being different from the epoxy flux; forming a second reflowable connector on the first flux; and performing a single thermal process to simultaneously cure the epoxy flux, remove the first flux, reflow the first reflowable connector, and reflow the second reflowable connector.

In some embodiments, the method further includes: printing the epoxy flux on the first pad with a first stencil, the first stencil having a first opening exposing the first pad. In some embodiments of the method, forming the first flux on the second pad includes: printing the first flux on the second pad with a second stencil, the second stencil having a second opening exposing the second pad, the second stencil having a recess covering the passive device. In some embodiments of the method, after adhering the passive device, the epoxy flux has a main body disposed between the passive device and the second dielectric layer and a fillet extending along the second dielectric layer away from the main body, the main body having a void disposed therein. In some embodiments of the method, the fillet of the epoxy flux extends away from the main body by a first distance, the first distance being from 1 µm to 200 µm. In some embodiments, the method further includes: attaching a package substrate to the second pad with the second reflowable connector; and forming an underfill between the package substrate and the second dielectric layer, the underfill contacting sides of the epoxy flux and the passive device.

In an embodiment, a device includes: an integrated circuit die; an encapsulant at least partially encapsulating the integrated circuit die; a redistribution structure on the encapsulant, the redistribution structure being electrically connect to the integrated circuit die, the redistribution structure including a pad; a passive device including a conductive connector physically and electrically connected to the pad; and a protective structure disposed between the passive device and the redistribution structure, the protective structure surrounding the conductive connector, the protective structure including an epoxy flux, the protective structure having a void disposed therein.

In some embodiments of the device, the protective structure separates the void from the passive device, the redistribution structure, the conductive connector, and the pad. In some embodiments of the device, the protective structure separates the void from the passive device and the redistribution structure, and the void exposes surfaces of the conductive connector and the pad. In some embodiments of the device, the protective structure separates the void from the conductive connector and the pad, and the void exposes surfaces of the passive device and the redistribution structure. In some embodiments of the device, the void exposes surfaces of the conductive connector, the pad, the passive device, and the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
 encapsulating an integrated circuit die with an encapsulant;
 forming a redistribution structure on the encapsulant, the redistribution structure being electrically connected to the integrated circuit die, the redistribution structure comprising a first pad and a second pad;
 dispensing an epoxy flux on the first pad to form a protective structure;
 prior to curing the epoxy flux, pressing a passive device into the protective structure to physically couple the passive device to the first pad;
 after physically coupling the passive device to the first pad, forming a first conductive connector on the second pad; and
 performing a single thermal process to simultaneously cure the protective structure and reflow the first conductive connector, the first conductive connector physically and electrically coupling the passive device to the first pad after the single thermal process.

2. The method of claim 1 further comprising:
 placing the integrated circuit die adjacent to a conductive via, the redistribution structure being electrically connected to the conductive via; and
 encapsulating the conductive via with the encapsulant.

3. The method of claim 1, wherein the passive device comprises a second conductive connector, the passive device being pressed into the protective structure until the second conductive connector contacts the first pad, the second conductive connector comprising a reflowable material.

4. The method of claim 3, wherein performing the single thermal process reflows the second conductive connector.

5. The method of claim 3, wherein the protective structure has a void disposed between the passive device and the redistribution structure.

6. The method of claim 5, wherein the protective structure separates the void from the passive device, the redistribution structure, the second conductive connector, and the first pad.

7. The method of claim 5, wherein the protective structure separates the void from the passive device and the redistribution structure, and the void exposes surfaces of the second conductive connector and the first pad.

8. The method of claim 5, wherein the protective structure separates the void from the second conductive connector and the first pad, and the void exposes surfaces of the passive device and the redistribution structure.

9. The method of claim 5, wherein the void exposes surfaces of the second conductive connector, the first pad, the passive device, and the redistribution structure.

10. A method comprising:
 encapsulating an integrated circuit die with an encapsulant;
 depositing a first dielectric layer over the encapsulant and the integrated circuit die;
 forming a first metallization pattern extending along and through the first dielectric layer, the first metallization pattern electrically coupling the integrated circuit die;
 depositing a second dielectric layer over the first metallization pattern;
 forming a first pad and a second pad through the second dielectric layer, the first pad and the second pad electrically coupling the first metallization pattern;
 adhering a passive device to the first pad and the second dielectric layer with an epoxy flux, the passive device comprising a first reflowable connector, the first reflowable connector being physically and electrically coupled to the first pad after adhering the passive device;
 forming a non-epoxy flux on the second pad, the non-epoxy flux being different from the epoxy flux;
 forming a second reflowable connector on the non-epoxy flux; and
 performing a single thermal process to simultaneously cure the epoxy flux, remove the non-epoxy flux, reflow the first reflowable connector, and reflow the second reflowable connector.

11. The method of claim 10 further comprising:
dispensing the epoxy flux on the first pad with a first stencil, the first stencil having a first opening exposing the first pad.

12. The method of claim 11 wherein forming the non-epoxy flux on the second pad comprises:
dispensing the non-epoxy flux on the second pad with a second stencil, the second stencil having a second opening exposing the second pad, the second stencil having a recess covering the passive device.

13. The method of claim 10, wherein after adhering the passive device, the epoxy flux has a main body disposed between the passive device and the second dielectric layer and a fillet extending along the second dielectric layer away from the main body, the main body having at least one void disposed therein.

14. The method of claim 13, wherein the fillet of the epoxy flux extends away from the main body by a first distance, the first distance being from 1 μm to 200 μm.

15. The method of claim 10 further comprising:
attaching a package substrate to the second pad with the second reflowable connector; and
forming an underfill between the package substrate and the second dielectric layer, the underfill contacting sides of the epoxy flux and the passive device.

16. A method comprising:
encapsulating an integrated circuit die with an encapsulant;
forming a redistribution structure on the encapsulant, the redistribution structure being electrically connected to the integrated circuit die, the redistribution structure comprising a first pad and a second pad;
dispensing an epoxy flux on the first pad to form a protective structure;
pressing a passive device into the protective structure to physically couple the passive device to the first pad;
covering the passive device with a stencil, the stencil having an opening exposing the second pad;
cleaning the second pad through the opening in the stencil while the stencil covers the passive device; and
after cleaning the second pad, forming a first conductive connector on the second pad, wherein forming the first conductive connector comprises performing a single thermal process, the single thermal process curing the protective structure.

17. The method of claim 16 further comprising:
attaching a package substrate to the redistribution structure with the first conductive connector; and
forming an underfill between the package substrate and the redistribution structure, the underfill contacting sides of the protective structure and the passive device.

18. The method of claim 16, wherein cleaning the second pad comprises:
dispensing a non-epoxy flux on the second pad, the single thermal process removing the non-epoxy flux.

19. The method of claim 16, wherein the epoxy flux comprises a resin material and a flux material.

20. The method of claim 16, wherein performing the single thermal process comprises:
heating the first conductive connector and the protective structure at a temperature in a range of 217° C. to 260° C. for a duration in a range of 30 seconds to 150 seconds.

* * * * *